United States Patent [19]

Arakawa et al.

[11] Patent Number: 6,067,101
[45] Date of Patent: May 23, 2000

[54] POWER SOURCE CIRCUIT HAVING CHARGE FUNCTION AND RECORDING APPARATUS

[75] Inventors: Junichi Arakawa, Yokohama; Makoto Kashimura, Tokyo; Toshihiko Bekki, Kawasaki; Hideo Horigome; Kazuyuki Masumoto, both of Tokyo, all of Japan

[73] Assignee: Canon Kabushiki Kaisha, Tokyo, Japan

[21] Appl. No.: 08/262,775

[22] Filed: Jun. 20, 1994

Related U.S. Application Data

[63] Continuation of application No. 07/741,039, Aug. 6, 1991, abandoned.

[30] Foreign Application Priority Data

Aug. 6, 1990 [JP] Japan ................................. 2-208715
Aug. 11, 1990 [JP] Japan ................................. 2-212970
Aug. 11, 1990 [JP] Japan ................................. 2-212971

[51] Int. Cl.⁷ .......................... B41J 29/393; H04N 1/46
[52] U.S. Cl. ........................................ 347/19; 358/504
[58] Field of Search .................... 347/19; 320/35, 320/37, 38, 150, 152; 358/504, 406

[56] References Cited

U.S. PATENT DOCUMENTS

| | | | |
|---|---|---|---|
| 3,944,904 | 3/1976 | Hase | 320/23 |
| 4,313,124 | 1/1982 | Hara | 346/140 R |
| 4,345,262 | 8/1982 | Shirato et al. | 346/140 R |
| 4,459,600 | 7/1984 | Sato et al. | 346/140 R |
| 4,463,359 | 7/1984 | Ayata et al. | 346/1.1 |
| 4,558,333 | 12/1985 | Sugitani et al. | 346/140 R |
| 4,567,421 | 1/1986 | Dattilo | 320/30 |
| 4,723,129 | 2/1988 | Endo et al. | 346/1.1 |
| 4,740,796 | 4/1988 | Endo et al. | 346/1.1 |
| 4,820,965 | 4/1989 | Siemer | 320/31 |

FOREIGN PATENT DOCUMENTS

| | | |
|---|---|---|
| 0222381 | 5/1987 | European Pat. Off. . |
| 0273322 | 7/1988 | European Pat. Off. . |
| 3832841 | 3/1990 | Germany . |
| 57-98147 | of 1982 | Japan . |
| 58-25527 | of 1983 | Japan . |
| 59-123670 | 7/1984 | Japan . |
| 59-138461 | 8/1984 | Japan . |
| 60-137387 | 9/1985 | Japan . |
| 60-216728 | 10/1985 | Japan . |
| 2086674 | 5/1982 | United Kingdom . |

*Primary Examiner*—N. Le
*Assistant Examiner*—Thinh Nguyen
*Attorney, Agent, or Firm*—Fitzpatrick, Cella, Harper & Scinto

[57] ABSTRACT

A power source circuit having a charge circuit for charging a chargeable battery includes a charge function having a circuit for detecting a battery voltage of the battery after the passage of a predetermined period at a charge voltage rising stage since the start of charging, a device for judging the life of the battery by comparing a detected result of the detecting circuit with a reference value, and a device for stopping the charge of the battery in accordance with the judgment of a battery failure by the judging device.

39 Claims, 15 Drawing Sheets

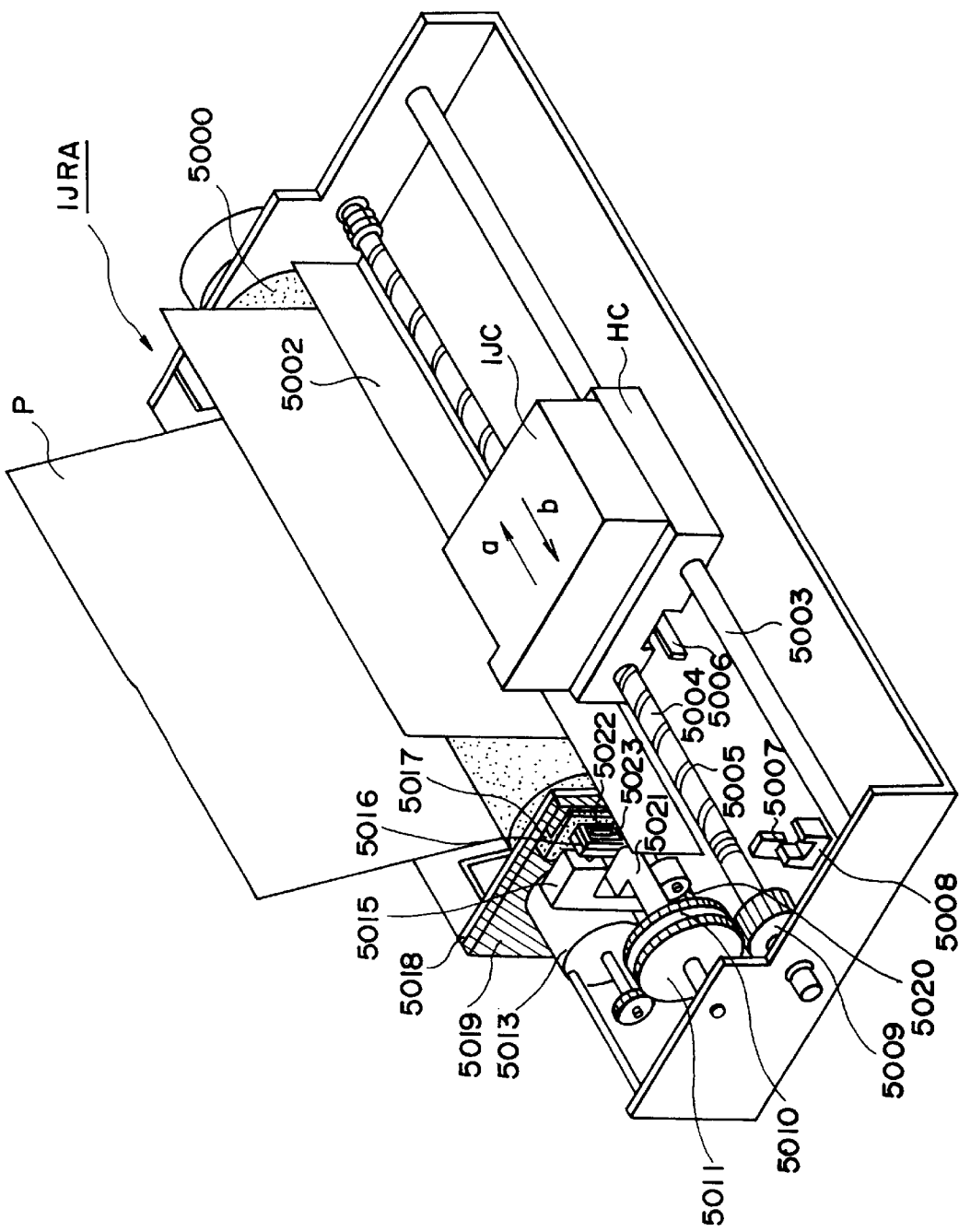

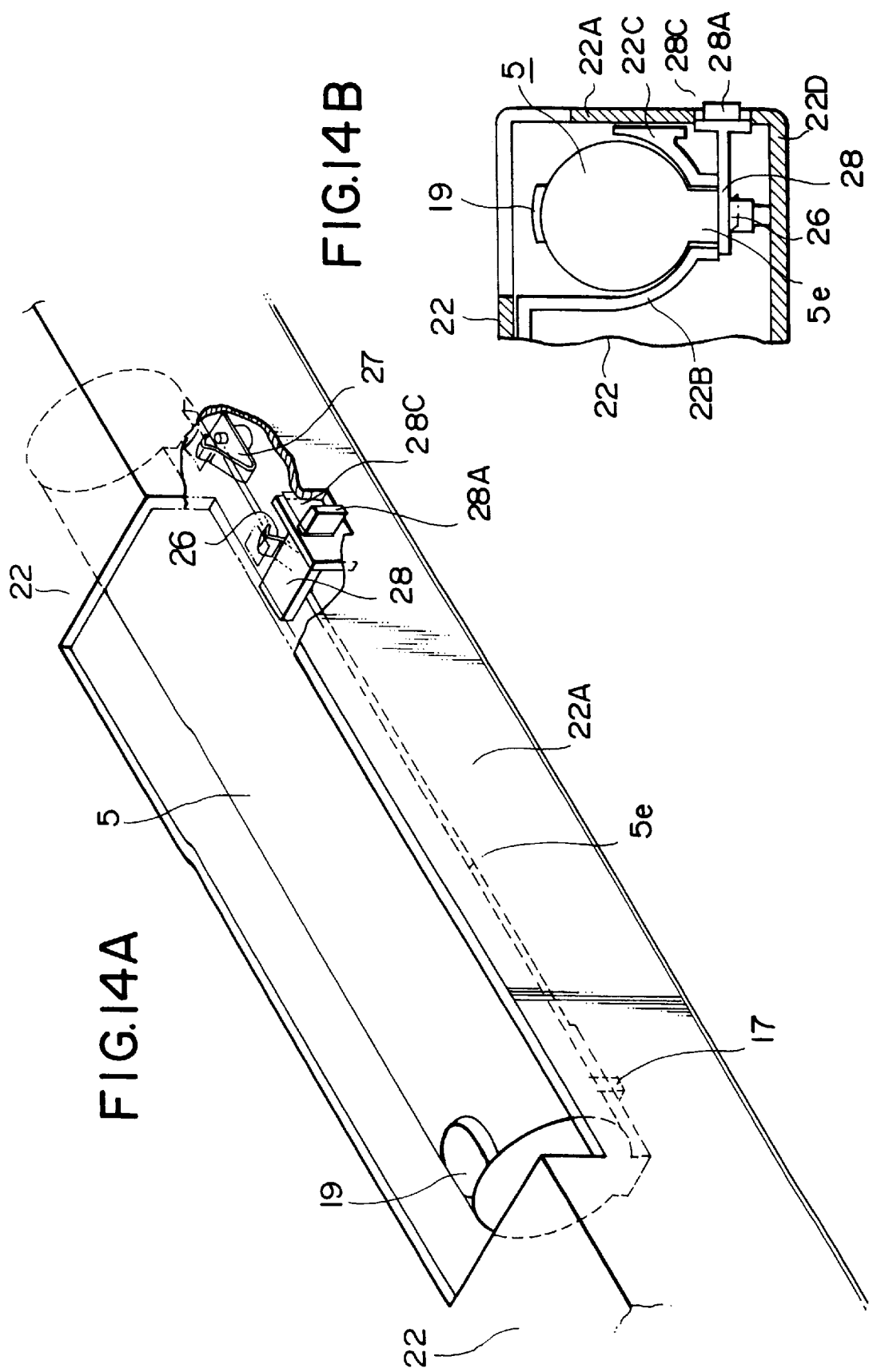

POWER SOURCE CIRCUIT HAVING CHARGE FUNCTION AND RECORDING APPARATUS

This application is a continuation of application Ser. No. 07/741,039 filed Aug. 6, 1991, now abandoned.

BACKGROUND OF THE INVENTION

1. Field of the Invention

The present invention relates to a power source circuit having a charge function applicable to an equipment with a chargeable driving mechanism, and a printer having a charge function applicable thereto and connected to or contained within an image forming apparatus such as a copying machine, a personal computer, or a word processor. Particularly, the present invention is more effective for use with an ink jet recording apparatus which records by discharging the recording liquid onto a recording medium such as a paper or film.

2. Related Background Art

Conventionally known charging methods can be largely classified into the constant current method such as standard charge (non-control), short time charge (non-control, timer control method), and quick charge (voltage control method, V taper control method), and the constant voltage method. As the former, typical of a chargeable secondary cell (battery) is a NiCd secondary cell, and as the latter, a carbon lithium or vanadium lithium secondary cell are known.

On the other hand, the copying machine or ink jet printer having the secondary cell has been put to practical use, in which the charging method is often separately provided, and expensive. This fact opposes to a requirement for the printer that the apparatus should be smaller, lighter and in lower cost.

The present invention was achieved from the point of the charging method in view of the above state of the art, because it is incorrect to utilize a battery which may not effect a sufficient accumulation of electricity by charging, so that the charge is attempted many times wastefully, or in the extreme case, a problem is caused that a charge circuit may be destroyed.

However, even if the inexpensive constitution of judging the battery life might be created, there was a tendency of increasing the judging time.

It is a main object of the present invention to provide a power source circuit having a reliable and inexpensive charge function which allows the judgment in a relatively short time, without damaging the charge function, and it is a further object to provide a suitable charge function for the cheap, small printer.

Typical of the present invention is a power source circuit as a first embodiment comprising a charge circuit for charging a chargeable battery, and having a charge function characterized by including a circuit for detecting a battery voltage of the battery after the passage of a predetermined period at a charge voltage rising stage since the start of charging, means for judging the life of the battery by comparing a detected result of the detecting circuit with a reference value, and means for stopping the charge of the battery in accordance with the judgment of a battery failure by the judging means, and a printer as a second embodiment comprising a power source circuit including a charge circuit for charging a chargeable battery for use in recording with recording means, characterized in that the printer comprises means for detecting a battery voltage of the battery after the passage of a predetermined period at a charge voltage rising stage since the start of charging, means for judging the life of the battery by comparing a detected result of the detecting circuit with a reference value, and means for stopping the charge of the battery in accordance with the judgment of a battery failure by the judging means.

These present embodiments were achieved by noticing that the variation in the charging state for an abnormal battery with its span of life exhausted was different from that for a normal battery, as a result of examining the rising state of the battery voltage at the charging stage, and concluding that the judgment could be performed even at the early stage from the start of charging.

According to the present invention, a cheap, quick and reliable judgment can be accomplished, so that it is possible to provide a power source circuit with an improved reliability of the charge function and without wasted operation time, and particularly, a printer with the recording unusable time largely reduced.

Next, the characteristics of a further preferred embodiment will be described in the following.

The judgment criterion of the present invention is such that the difference between the curves 1 and 2 of FIG. 10 as will be described later is judged, but to accomplish a further longer life of the charge function, the reference value as above mentioned is set to be the same value as a rating of the battery (including a rating of about −0.5V in a substantially equivalent sense), and the predetermined period as above mentioned is preferably within several minutes after starting of the charge during which the normal battery can exceed the reference value. This is because the charge function itself is set to allow a stable charge for the rating of the battery.

Next, to realize a lower price of the whole apparatus, the charge circuit is composed of transistors, current control resistors and a temperature fuse arranged in parallel with the resistors, and the charge stopping means has preferably a function of indicating battery trouble.

Since the battery voltage may be changed in a range from about 2V to 5V due to the environmental temperature, it is further preferable to correct for this variation so that there is no influence with the variation. Specifically, considering the temperature elevation in the service condition, it is preferable that the detecting circuit or the judging means has means for correcting for the detected result or the reference value in accordance with the environmental condition. This correction can be made by increasing the detected voltage with the elevation of temperature, or decreasing the reference value. As another method, it is also preferable to control the charge to be stopped after performing plural times of the judgment, thereby making the final judgment after stabilizing the measurement state against the temperature elevation. Herein, it is also included that the failure is once judged for the apparatus, and then the final judgment is made by making the above judgment to obtain a reconfirmation of changing the battery.

As for the printer, it is also preferable in practical use that the above reference value is made a voltage at which the recording can be accomplished with the recording means or a voltage at which means for maintenance of the recording head can be activated. This maintenance means includes a cap or cleaning means as will be described later, for example, but is not limited to them.

The present invention is suitable particularly to the printer comprising a thermal recording head for recording by the use of thermal energy as the recording means and a recording medium to be recorded so that they are movable relative to each other, and further to an ink jet recording apparatus in which the ink is discharged by the use of the film boiling of ink which is caused by thermal energy.

Moreover, another representive aspect of the present invention is a recording apparatus as a third embodiment comprising a power supply circuit having a charge circuit for charging a chargeable battery, wherein the recording apparatus has a charge function characterized by comprising a circuit for detecting a power supply voltage before starting of the charge or during the charge, means for judging whether or not the charging power is supplied by comparing a detected result of the detecting circuit with a reference value, and means for stopping the charge of the battery in accordance with the judgment of a failure by the judging means, and as a fourth embodiment, a recording apparatus having a power source circuit including a charge circuit for charging a chargeable battery for use in recording with recording means, characterized by comprising means for detecting the battery voltage of the battery before charging in a charge mode, means for judging the mounting state of the battery by comparing a detected result of the detecting circuit with a reference value, and means for indicating the absence of a battery in accordance with the judgment of a battery failure by the judgment means.

According to the third embodiment of the present invention, it is possible to sufficiently cope with the change of the charge state which is typical of an absence of an adaptor during the charge process, thereby resolving a charge failure or a disadvantage of consuming wastefully the previously charged power. Particularly, a cheap, quick and reliable judgment can be accomplished, providing a recording apparatus with an improved reliability of the charge function and without a wasteful operation time.

According to the fourth embodiment of the present invention, the charge function can be accommodated without any mechanical judgment, and as a whole, a cheap, quick and reliable judgment can be accomplished, providing a recording apparatus with an improved reliability of the charge function and without a wasteful operation time.

To realize a lower price of the whole apparatus, the charge circuit is composed of transistors, current control resistors and a temperature fuse arranged in parallel with the resistors, and the charge stopping means has preferably a function of indicating battery trouble.

Since the battery voltage may change in a range from about 2V to 5V due to the environmental temperature, it is further preferable to correct for this variation so that there is no influence with the variation. Specifically, considering the temperature elevation with the service condition, it is preferable that the detecting circuit or the judging means has means for correcting for the detected result or the reference value in accordance with the environmental condition. This correction can be made by increasing the detected voltage with the elevation of temperature, or decreasing the reference value. As another method, it is also preferable to control the charge to be stopped after performing plural times of the judgment, thereby making the final judgment after stabilizing the measurement state against the temperature elevation. Herein, it is also included that the failure is once judged for the apparatus, and then the final judgment is performed by making the above judgment to obtain a reconfirmation of changing the battery.

As a maintenance means, a cap or cleaning as will be described later is included, for example.

Also, addition of a restoration means for the recording head, a preliminary auxiliary means, etc. provided as the constitution of the recording device of the present invention is preferable, because the effect of the present invention can be further stabilized. Specific examples of these may include, for the recording head, capping means, cleaning means, pressurization or suction means, electricity-heat converters or other type of heating elements, or preliminary heating means according to a combination of these, and it is also effective for performing stable recording to perform a preliminary mode which performs discharging separate from recording.

Further, as the recording mode of the recording device, the present invention is extremely effective for not only the recording mode only of a primary color such as black, for example, but also a device equipped with at least one of plural different colors or full color by color mixing, whether the recording head may be either integrally constituted or combined in plural number.

Another embodiment as will be described in the example of the present invention is significant in the art and preferable for the present invention. The present invention will be more clearly understood from the following description.

BRIEF DESCRIPTION OF THE DRAWINGS

FIG. 6 is an external view of the apparatus according to the present invention.

FIGS. 14A, 14B and 14C are a perspective view, a transverse cross-sectional view and a state explanation view for a battery and a battery case formed in a part of the printer in one example according to the present invention, when a battery switch is on.

DETAILED DESCRIPTION OF THE PREFERRED EMBODIMENTS

FIGS. 2 to 6 are explanation views for explaining an ink jet unit IJU, an ink jet head IJH, an ink tank IT, an ink jet cartridge IJC, an ink jet recording apparatus main body IJRA, and a carriage HC, and their interrelations. The explanation of each constitution will be given with reference to these drawings.

Figure 2:
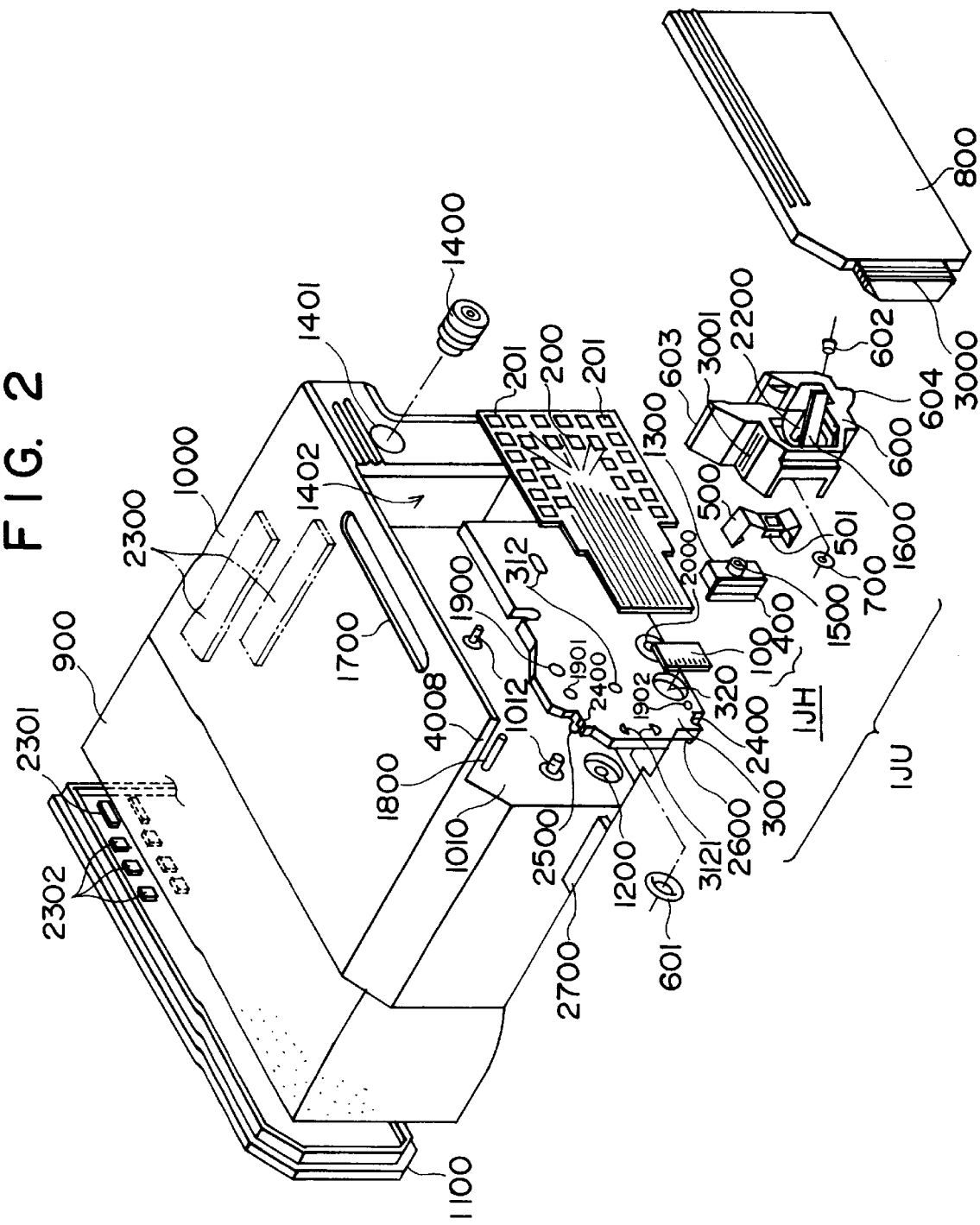
FIG. 2 is an exploded perspective view of a cartridge according to the present invention.
Figure 3:
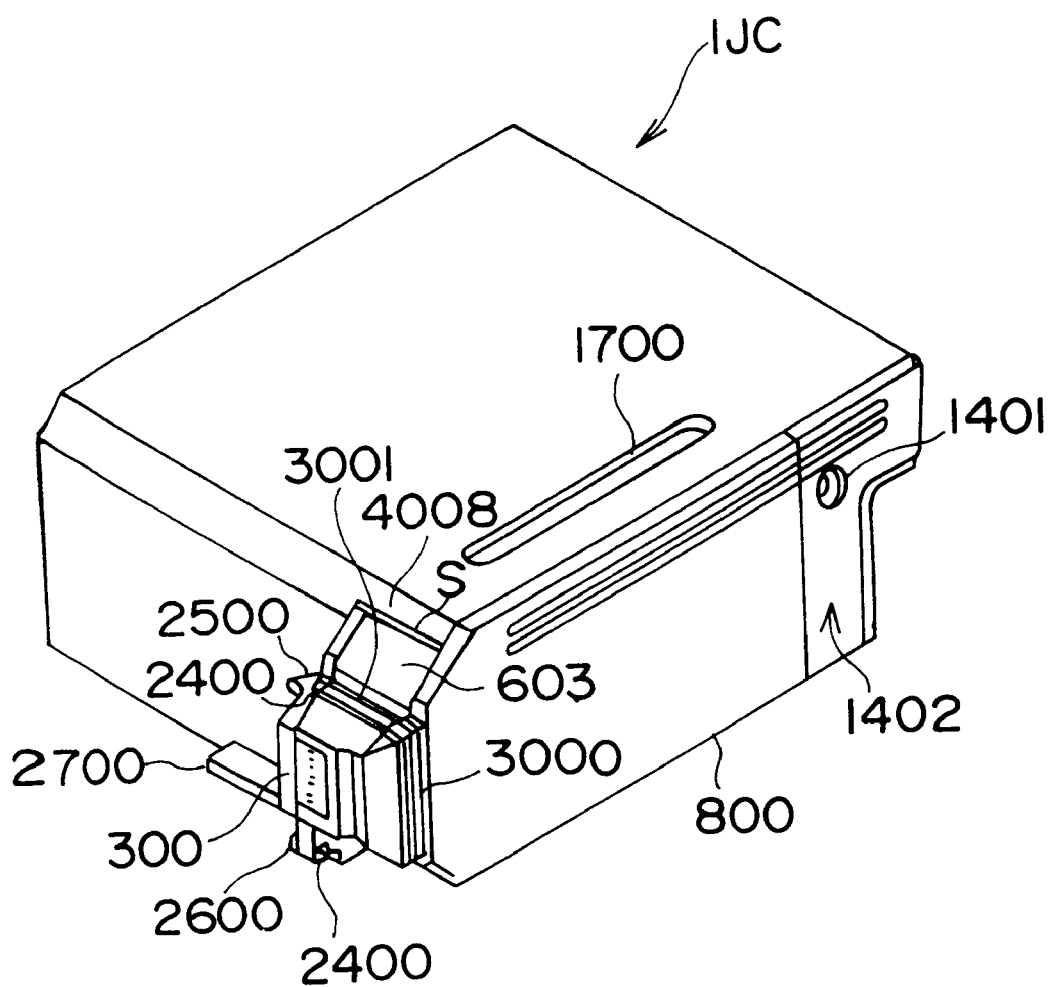
FIG. 3 is an assembled perspective view.

The ink jet cartridge IJC in this example has a large storage portion of ink, as will be seen from the perspective view of FIG. 3, and is of a shape in which a leading end portion of the ink jet unit IJU projects slightly from a front face of the ink tank IT. This ink jet cartridge IJC is fixed and supported by positioning means and electrical contacts as will be described later for the carriage HC (FIG. 5) laid on an ink jet recording apparatus main body IJRA, and is of a disposable type detachable from the carriage HC. This example as shown in FIGS. 2 to 6 has a constitution to which various new techniques achieved in the creating stage of the present invention are applied, and the whole invention will be described while briefly explaining the constitution of them.

(i) Constitution of ink jet unit IJU

The ink jet unit IJU is a unit with the bubble jet method for recording by the use of electricity-heat converters for generating heat energy which causes film boiling in the ink in accordance with an electric signal.

In FIG. 2, 100 is a heater board comprising electricity-heat converters (discharge heaters) arranged in a plurality of arrays on a Si substrate and electrical wirings of Al for supplying the electric power to them and formed using the film creation technique. 200 is a wiring substrate for the heater board 100, having wirings (e.g., connectable with the wire bonding) corresponding to the wirings of the heater board 100 and a pad 201 located at an end portion of the wirings for receiving the electrical signal from the main apparatus.

1300 is a grooved ceiling plate provided with partition walls for separating a plurality of ink channels from each other, and a common liquid chamber for reserving the ink to be supplied to each ink channel, in which an ink receiving port 1500 for receiving the ink supplied from the ink tank IT and introducing it to the common liquid chamber and an orifice plate 400 having a plurality of discharge port s corresponding to respective ink channels are integrally formed. The integral forming material is preferably polysulfone, but other forming resin materials also can be used.

Figure 5:
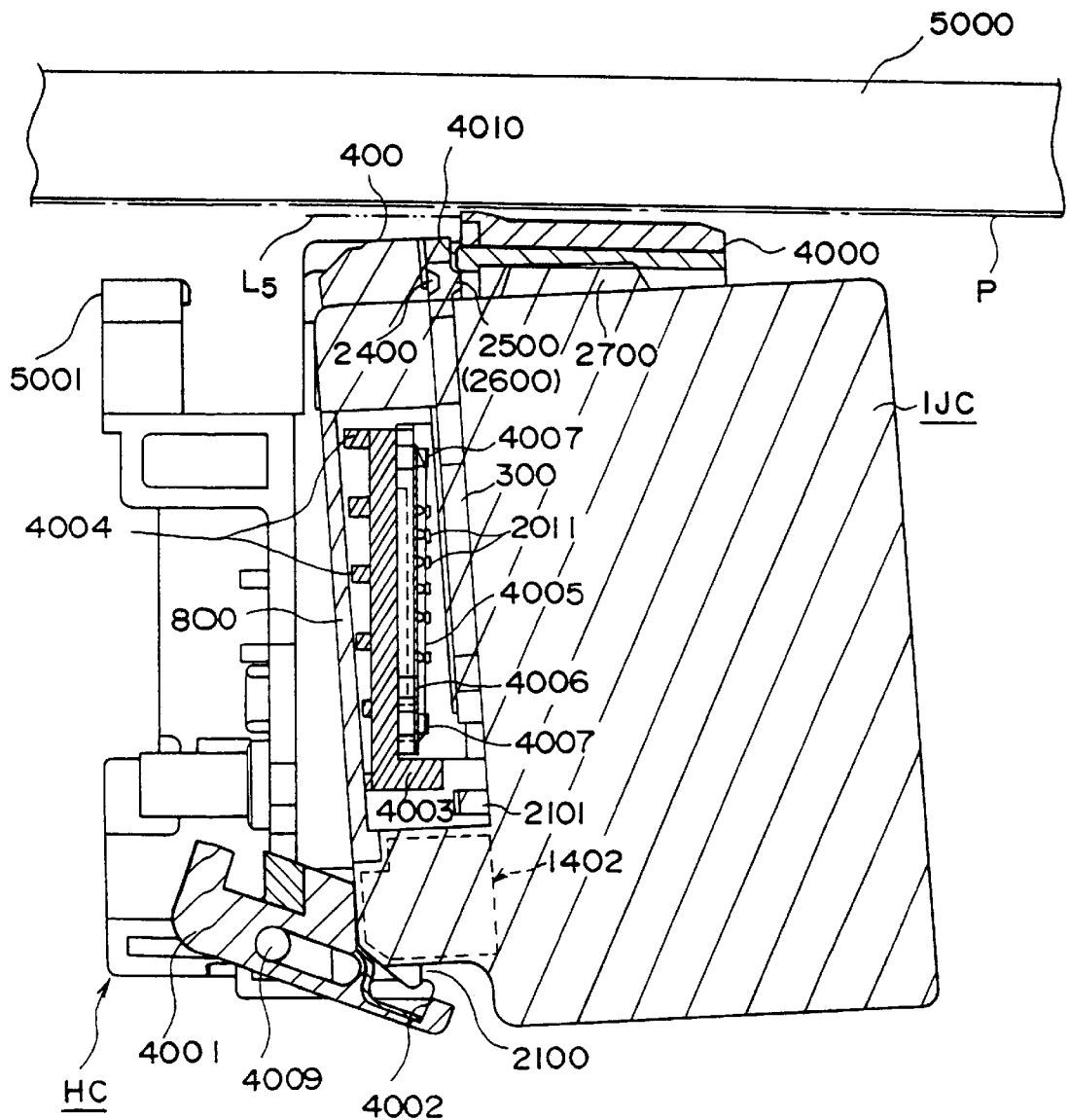
FIG. 5 is a view for explaining the mounting of the cartridge IJC according to the present invention onto an apparatus.

300 is a support body, for example, of metal, for supporting a back face of the wiring substrate 200 in a plane, which can serve as a bottom plate of the ink jet unit. 500 is a presser spring of M-character shape for pressing concentratively a part of the liquid channel, preferably, an area in the neighborhood of discharge ports, at the line pressure, with a front flap 501, as well as pressing lightly the common liquid chamber at a central portion of the M-character. With the heater board 100 and the ceiling board 1300 being held in a sandwiched state, by a foot portion of the presser spring which passes through a hole 3121 of the support body 300 and engages a back side of the support body 300, the heater board 100 and the ceiling plate 1300 can be fixed under the pressure by a concentrated urging force of the presser spring 500 and its front flap 501. Also, the support body 300 has positioning holes 312, 1900, 2000 engaging two positioning projections 1012 of the ink tank IT and positioning and thermal fusion holding projections 1800, 1801, and positioning projections 2500, 2600 for the carriage HC of the apparatus main body IJRA on the back side. In addition, the support body 300 has also a hole 320 for passing an ink supply tube 2200 (hereinafter described) therethrough which allows the supply of ink from the ink tank. The mounting of the wiring substrate 200 on the support body 300 can be performed with an adhesive. Note that recesses 2400, 2400 of the support body 300 are provided near the positioning projections 2500, 2600 (on the back side), respectively. And they lie on a plurality of extension lines of parallel grooves 3000, 3001 formed in peripheral three sides for a leading end area of the head portion in the assembled ink jet cartridge IJC (FIG. 3). Therefore, unnecessary matters such as contaminants or inks migrating along the parallel grooves 3000, 3001 will not lead to projections 2500, 2600. A lid member 800 having the parallel grooves 3000 formed therein forms a space portion for storing the ink jet unit IJU, together with the ink tank, as well as forming an external wall of the ink jet cartridge IJC as shown in FIG. 5. Also, the ink supply member 600 having the parallel grooves 3001 formed therein forms an ink conduit 1600 communicating to the ink supply tube 2200 as previously described, in a cantilevered form with the supply tube side 2200 secured thereto, having a sealing pin for securing the capillary phenomenon between a secured side of the ink conduit and the ink supply tube 2200. Note that 601 is a packing for making a connecting seal between the ink tank IT and the supply tube 2200, and 700 is a filter provided at an end portion of the supply tube on the tank side thereof.

The ink supply member 600 is cheap and high in positional accuracy due to the molding, thereby eliminating the decreased accuracy on the formation and fabrication, and further allows a stable abutment state against the ink receiving port 1500 of the conduit 1600, because the ink supply conduit 1600 is constructed in a cantilevered structure, so that it is a suitable structure for mass production. In this example, under this abutment state, a more complete communicating state can be obtained surely, simply by flowing a sealing adhesive from the side of the ink supply member thereinto. Note that the fixation of the ink supply member 600 to the support body 300 can be performed simply by passing pins (not shown) on the back side of the ink supply member 600 through holes 1901, 1902 of the support body 300 and fusing by heat the protruding portions onto the back side of the support body 300. Note that small projecting areas on the back portion heat fused are stored in depressions (not shown) within the wall face on the mounting side for the ink jet unit IJU, so that the positioning face of unit IJU can be obtained correctly.

(ii) Constitution of ink tank IT

The ink tank is constituted of a cartridge main body 1000, an ink absorbing member 900, and a lid member 1100 for sealing the ink absorbing member 900 after inserting it from the side opposite to the unit IJU mounting face of the cartridge main body 1000.

900 is an absorbing member for impregnating the ink, disposed within the cartridge main body 1000. 1200 is a supply port for supplying the ink to the unit IJU consisting of each portion 100 to 600 as above described, as well as an injection port for impregnating the ink into the absorbing member 900 by injecting the ink through the supply port 1200 in a process before disposing the unit on a portion 1010 of the cartridge main body 1000.

In this example, the portion for supplying the ink is an atmosphere communicating port and this supply port, in which an air existing area within the tank formed by a rib 2300 within a main body 1000 and partial ribs 2302, 2301 of the lid member 1100 to effect the excellent supply of ink from the ink absorbing member is formed from the side of the atmosphere communicating port 1401 consecutively over a cover area farthest from the ink supply port 1200, whereby it is important that the supply of ink into a relatively excellent and uniform absorbing member is performed from the side of this supply port 1200. This method is quite effective in practical use. This rib 2300 has four parallel ribs in a direction of the carriage movement on a back face of the ink tank main body 1000, thereby preventing the absorbing member from adhering to the back face. Also, the partial ribs 2301, 2302 are provided in an inner face of the lid member 1100 in an extension line corresponding to the rib 2300, but unlike the rib 2300, they are divided, providing a greater air existing space than the former. Note that the partial ribs 2302, 2301 are distributed in a face less than half the total area of the lid member 1100. Owing to these ribs, the ink on a corner area of the ink absorbing member farthest from the tank supply port 1200 could be introduced into the supply port 1200 with a capillary force stably and securely. 1401 is an atmosphere communicating port provided on the lid member for communicating an inside of the cartridge to the atmosphere. 1400 is a water repellent member disposed inward of the atmosphere communicating port 1401, thereby to prevent the leakage of ink from the atmosphere communicating port 1400.

An ink storage space of the ink tank IT is shaped as a rectangular parallel piped, with its longer sides being placed laterally, wherein the arrangement of the ribs as above described is particularly effective, but when the longer side is placed in a movement direction of the carriage, or it is a cube, the supply of ink from the ink absorbing member 900 can be stabilized by providing the ribs over the whole area of the lid member 1100. The rectangular parallel piped is appropriate to store the ink within a limited space as much as possible, but in order to use the stored ink for the recording without waste, it is important to provide the ribs having the above effect on two face regions in the vicinity of the corner area, as above described. Moreover, the inner face ribs of the ink tank IT in this example are arranged in almost uniform distribution with respect to the thickness direction of the ink absorbing member of the rectangular parallelopiped shape. This constitution is important because the atmospheric pressure distribution can be equalized in consuming the ink within the whole absorbing member, and remaining ink can be substantially eliminated. Moreover, describing in detail the technical concept for the arrangement of the ribs, when a circular arc with the longer side as the radius is drawn around a position where the ink supply port 1200 of the ink tank is projected onto a rectangular upper face of the rectangular parallelopiped, it is important to dispose the ribs on the face outside of its circular arc so that the atmospheric pressure state should be given early to the absorbing member located outward of its circular arc. In this case, the atmosphere communicating port of the tank is not limited to this example as long as the atmosphere can be introduced into this rib disposed region.

In addition, in this example, a constitution is taken in which a necessary space for incorporation into the apparatus is minimized by making planar the back face of the ink jet cartridge IJC with respect to the head, and the storage amount of ink is maximized, so that the creation of a smaller apparatus can be accomplished and the change frequency of the cartridge can be decreased. And by using a back portion of the space for integrating the ink jet unit IJU, a protruding portion for the atmosphere communicating port 1401 is formed therein, and by making an interior of this protruding portion hollow, an atmospheric pressure supply space 1402 is formed for the whole thickness of the absorbing member 900 as previously described. By configuring in this way, a superior cartridge could be provided as compared with a conventional one. Note that this atmospheric pressure supply space 1402 is a much larger space than the conventional one, and as the atmosphere communicating port 1401 is located upward, the atmospheric pressure supply space 1402 can hold the ink temporarily even if the ink is left from the absorbing member due to some failure, thereby securing the withdrawal of the ink into the absorbing member, so that an excellent cartridge without waste can be provided.

Figure 4:
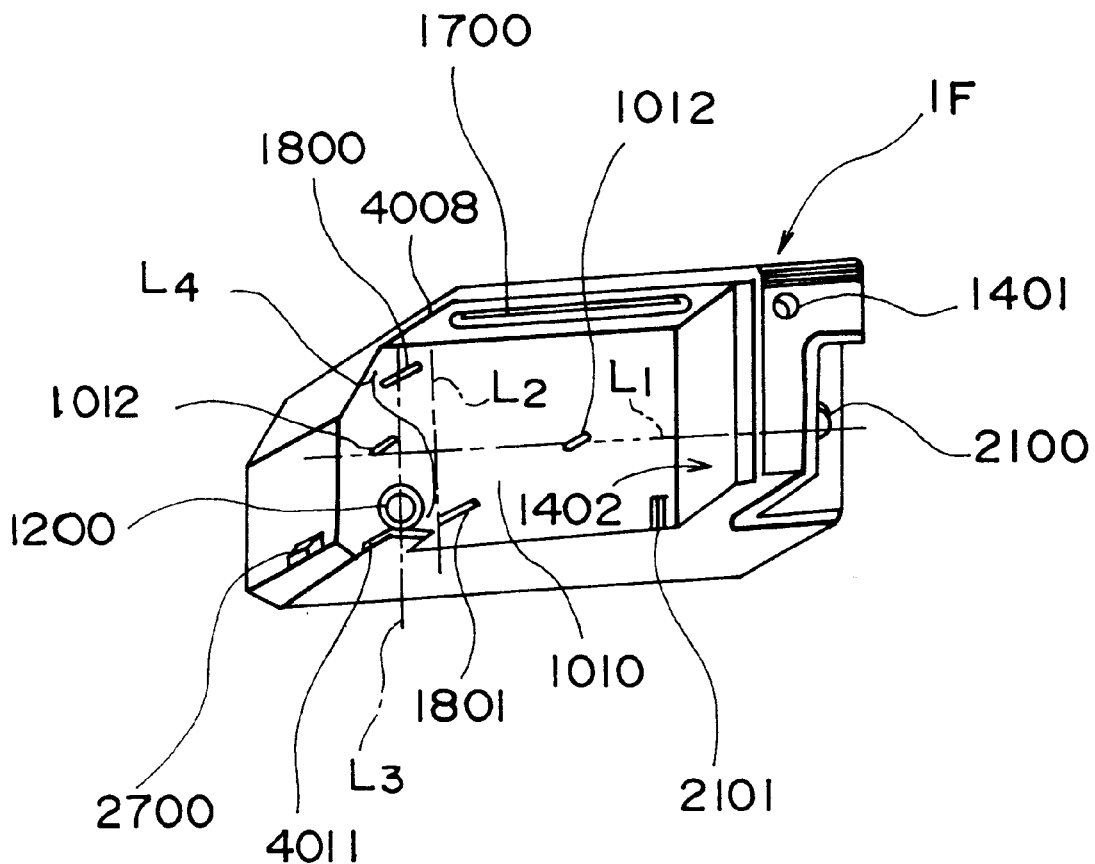
FIG. 4 is a perspective view of a mounting portion for an ink jet unit IJU.

The constitution of the mounting face in the above unit IJU of the ink tank IT is shown in FIG. 4. Assuming that the straight line passing through substantially a central position of a protruding port in an orifice plate 400 and parallel to a bottom face of the tank IT or a laying reference face on the surface of the carriage is $L_1$, two positioning projections 1012 engaging holes 312 of the support member 300 lie on this straight line $L_1$. The height of this projection 1012 is slightly smaller than the thickness of the support member 300, for positioning the support member 300. In this figure, in the extension of the straight line $L_1$ is located a click 2100 engaged by an engaging face 4002 at the 90 degree corner of a positioning hook 4001 for the carriage, and the action force for positioning the carriage is configured to be exerted on a face region parallel to the reference face including this straight line $L_1$. As will be described in FIG. 5, these relations are effective because the positioning accuracy for only the ink tank is the same as that of the head discharge port.

Also, projections 1800, 1801 of the ink tank corresponding to respective fixing holes 1900, 2000 to the ink tank side of the support member 300 are longer than the projection 1012 as previously described, and can serve to fix the support member 300 to its side face by thermally fusing a portion penetrating through the support member 300 and protruding therefrom. Assuming that the straight line $L_3$ perpendicular to the above line $L_1$ and passing through this projection 1800 is $L_3$, and the straight line passing through the projection 1801 is $L_2$, a center of the supply port 1200 is substantially located on the straight line $L_3$, thereby acting to stabilize the joined state between an opening 1200 of the supply portion and the supply tube 2200, and reducing the load against the joined state which is caused by dropping or impact, and therefore it is a preferred constitution. Also, the straight lines $L_2$, $L_3$ do not coincide, and the projections 1800, 1801 exist around the projection 1012 on the discharge port side of the head IJH, further yielding an auxiliary effect for positioning the head IJH with respect to the tank. Note that the curve as indicated by $L_4$ is the position of an outer wall of the ink supply member 600 mounted therein. The projections 1800, 1801 are located along the curve $L_4$, thereby giving sufficient strength and positional accuracy to the weight of the construction on the leading end side of the head IJH. Note that 2700 is a leading end collar of the ink tank IT which is inserted into a hole in a front plate 4000 of the carriage and provided for such a trouble that the level of the ink tank is extremely bad. 2101 is a loose stop for the cartridge provided for a bar of the carriage HC, not shown, and enters a lower portion of the bar at a position where the cartridge IJC is mounted swingingly as will be described later, serving as a protective member to maintain the mounting state even if a force is exerted upwardly to deviate the cartridge from the positioned state unnecessarily.

If assembled as the ink jet cartridge IJC, the ink is supplied from the inside of the cartridge through the supply port 1200, the hole 320 provided on the support member 300 and an inlet port provided on the back side of the supply tank 600 into the supply tank 600, and then after passing through its inside, flows from the inlet port through an appropriate supply tube and an ink inlet port 1500 of the ceiling plate 1300 into a common liquid chamber. At a connecting portion for communicating the ink, a packing of silicone rubber or butyl rubber, for example, is disposed, thereby sealing therein, and securing the ink supply passage.

Note that in this example, the ceiling plate 1300 is made of an ink resisting resin such as polysulfone, polyethersulfone, polyphenylene oxide or polypropylene, and integrally molded with an orifice plate portion 400 within a mold concurrently.

As above described, since integral molded parts are the ink supply member 600, an integral member of the ceiling plate 1300 and the orifice plate 400, and the ink tank main body 1000, the assembly accuracy can be at a higher level, and is extremely effective for improving the quality of the product in mass production. Also, the number of parts can be reduced as compared with a conventional one, exhibiting the superior desired characteristics securely.

Also, in the example of the present invention, regarding the shape after assembling as above described, the ink supply member 600 has its upper face portion 603 forming a slit S with respect to an end portion 4008 in a roof portion of the ink tank IT having a slit 1700 as shown in FIG. 3, and a lower face portion 604 forming a slit (not shown) similar to the slit S with respect to a head side end portion 4011 of a thin member to which a lower lid 800 of the ink tank IT is bonded, as shown in FIGS. 2 to 4. These slits between the ink tank IT and the ink supply member 600 substantially perform the action of further promoting the heat radiation, and unnecessary force applied onto the ink tank IT, if any, is prevented from directly acting on the supply member, or particularly the ink jet unit IJT.

In any case, the above constitution of this example is one as conventionally not found, providing an organic constitution because each constitution provides a favorable effect not only singly but also in combination.

(iii) Mounting of the ink jet cartridge IJC to the carriage HC

In FIG. 5, 5000 is a platen roller for guiding a recording medium P from a lower to an upper side of a paper face. The carriage HC moves along the platen roller 5000, wherein there are provided a front plate 4000 (with a thickness of 2 mm) located on a front face side of the ink jet cartridge IJC on the front platen side of the carriage, an electrical connecting portion support plate 4003 for holding a flexible sheet 4005 comprising a pad 2011 corresponding to a pad 201 of a wiring substrate 200 of the cartridge IJC and a rubber pad sheet 4007 for generating the elastic force pressing the flexible sheet to each pad 2011 from the back face side, and a positioning hook 4001 for securing the ink jet cartridge IJC to a recording position. The front plate 4000 has two positioning protruding faces 4010 corresponding to the positioning projections 2500, 2600 as previously described of the support member 300 in the cartridge, respectively, and is subjected to a normal force to the protruding face 4010 after mounting of the cartridge. Therefore, an auxiliary rib has a plurality of ribs (not shown) directing toward a direction of its normal force on the platen roller side of the front plate. This rib also forms a head protective protruding portion which protrudes slightly (about 0.1 mm) toward the platen roller side beyond a front face position $L_5$ when the cartridge IJC is mounted. The electrical connecting portion supporting plate 4003 has a plurality of auxiliary ribs 4004 in a vertical direction, but not in the above-indicated rib direction, with the lateral protruding proportion being decreased from the platen side to the hook side 4001. This serves the function of inclining the position when the cartridge is mounted, as shown. Also, the supporting plate 4003 has two positioning faces 4006 on the hook side corresponding to the protruding faces 4010 to exert the action force to the cartridge, in a direction opposite to the direction where the two positioning protruding faces 4010 exert the action on the cartridge, thereby to stabilize the electrical contact state, so that a pad contact region is formed between these two positioning faces and also the deformation amount of botch is uniquely defined for a botched rubber sheet 4007 corresponding to the pad 2011. These positioning faces are placed in the contact state with a surface of the wiring substrate 200 if the cartridge IJC is fixed at a recordable position. In this example, as the pads 201 in the wiring substrate 200 are distributed in symmetry with respect to the line Li as previously described, the deformation amount of each botch for the rubber sheet 4007 can be equalized to make the contact pressure of the pad 2011 more stable. The distribution of the pads 201 in this example is two rows in upside and downside, two rows vertically.

The hook 4001 has a long hole engaged by a fixed shaft 4009, whereby positioning of the ink jet cartridge IJC with respect to the carriage HC can be performed by moving it along the platen roller 500 toward the left side, after rotating it from a shown position in a counterclockwise direction by using a movement space of this long hole. The movement of this hook 4001 is performed in any way, but preferably performed by using a lever. In any case, when the hook 4001 is rotated, the cartridge IJC moves to the platen roller side, while the positioning projections 2500, 2600 move to the positions abutting on the positioning faces 4010 of the front plate, and by the leftward movement of the hook 4001, a 90 degree hook face 4002 comes in close contact with a 90 degree face of a click 2100 in the cartridge IJC, while the cartridge IJC is swiveled within a horizontal face around contact regions between positioning faces 2500 and positioning faces 4010, whereby the pads 201, 2011 are finally brought into contact. And if the hook 4001 is held at a predetermined position, i.e., at a fixed position, the complete contact state between pads 201 and pads 2011, the complete face contact between positioning faces 2500 and positioning faces 4010, the two-face contact between the 90 degree face 4002 and the 90 degree face of the click, and the face contact between the wiring substrate 300 and the positioning face 4006 are formed at the same time, completing the retention of the cartridge IJC to the carriage.

(iv) Schematic explanation of apparatus main body

FIG. 6 is a general view of an ink jet recording apparatus IJRA to which the present invention is applied, the carriage HC engaging into a line groove 5004 of a lead screw 5005 rotating via driving force transmission gears 5011, 5009 linked with the positive or negative rotation of a driving motor 5013 is provided with pins (not shown), being reciprocated in the directions of arrows a and b. 5002 is a paper presser plate for pressing a paper against a platen 5000 across the moving direction of the carriage. 5007, 5008 are photocouplers which are home position detecting means for switching the rotational direction of the motor 5013 by confirming the presence of a lever 5006 of the carriage in this area. 5016 is a member for supporting a cap member 5022 for capping a front face of the recording head, and 5015 is suction means for sucking an inside of the cap which makes the suction recovery of the recording head via an opening 5023 within the cap. 5017 is a cleaning blade, 5019 is a member for allowing the blade to move in forward and backward directions, both of which are supported on a main body support plate 5018. The blade is not limited to this form, but a well known cleaning blade also can be applied to this example. Also, 5021 is a lever for starting the suction in the suction recovery which moves along with the movement of a cam 5020 engaging the carriage, the driving force from the driving motor being controlled for the movement with well known transmission means such as a clutch switch.

These capping, cleaning and suction recovery features are constituted to perform their desired operations at corresponding positions by the action of the lead screw 5005 when the carriage comes to an area on the home position side, but if desired operations are allowed to be carried out at known timings, they can be all applied to this example. Each constitution as above described is a preferable invention as viewed either singly or in combination, and shows a preferable constitutional example for the present invention.

To describe in detail the present invention relating technically to FIGS. 2 to 6 as above, the explanation will be given with reference to FIG. 1 and FIG. 7 and its subsequent drawings.

Figure 1:
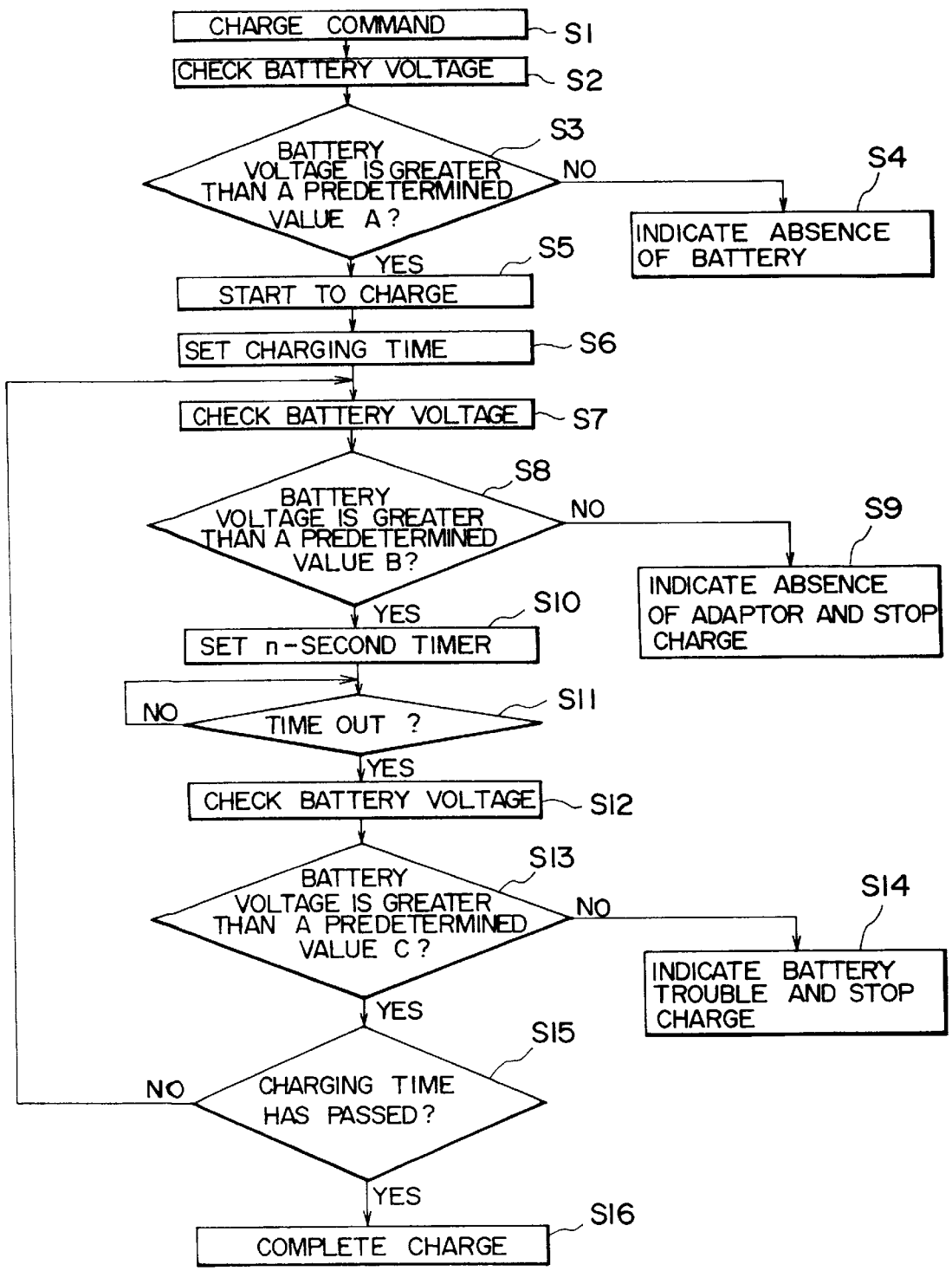
FIG. 1 is a flowchart of an example according to the present invention.

FIG. 1 shows a flowchart in an example according to the present invention, and the explanation will be given using FIGS. 9 to 11.

FIG. 1 shows the charge flow to be executed by receiving a charge command issued (process S1), sequentially performing a judgment process for judging the mounting state of a secondary battery, a judgment process for periodically judging the AC adaptor connecting state before or during the charge process, and a judgment process for an abnormal state of the battery (in this example, periodical check is performed in view of the fluctuation during the charge, but the present invention is not limited to this).

At a process S1, if the charge command is confirmed, the voltage of the battery to be loaded is checked (process S2). If the charge process is entered with the battery being mounted insecurely, a wasteful charge time is taken, and a trouble may occur in a power source circuit, and so this check has a meaning of preventing such trouble beforehand. In this example, the judgment is performed by comparing this battery voltage with a reference value A. This reference value A can be determined within a category where the battery does not enable the driving of the apparatus but the amount of stored electricity still exists, as the battery to be recharged may not be generally at the complete zero level of stored electricity, but at a level where the apparatus cannot be driven. In this example, the reference value A was set at 3V. Accordingly, if a judged result at process S3 is 3V or more, and determined is a presence of a battery, the charging is started at process S5.

Here, if below 3V, the absence of a battery is indicated because of no battery, and the routine cannot proceed to the charge process until the battery is loaded. In this case, the battery may not be correctly mounted, but this has an effect of prompting the operator to make the correction.

In the charge process, after start of the charging, at process S6, the charging time is set. In this example, as a NiCd secondary battery (five series arrangement of 1.2V battery: rating of 6.0V), 10 hours are set. Consecutively, at process S7, the battery voltage is checked. This is performed to prevent such troubles beforehand that the charging time is wastefully taken by detecting a connecting failure of the adaptor, and a charge failure may be brought about by discharging the stored electricity within the battery, or the feature of the battery is decreased into a complete false condition, irrespective of its usable condition. In this example, if it is assumed that the AC adaptor can supply a direct current of 9.5V, 1.5A, the NiCd secondary battery as above described is at about 7.8V at maximum when the charge is finished, so that by setting a predetermined value B to be 8V for the judgment criterion in process S8, the connecting state of the adaptor can be correctly determined periodically during the charge. As a result, when the battery voltage is greater than or equal to the predetermined value B, the routine proceeds to process S10, but if it is below the predetermined value B, the adaptor is in a non-connecting state, and so the charge is immediately stopped, and absence of an adaptor is indicated. Thereby, any trouble during the charge can be sufficiently dealt with. In this check process S7 for the battery voltage, it is easier for the judgment to stop the charge temporarily, but from the point of stability for charging, it is more preferable not to stop the charge. The processes S10 to S13 are to make the judgment of the battery life, based on the charge curve (see FIG. 10) at the charge rising stage.

Figure 10:
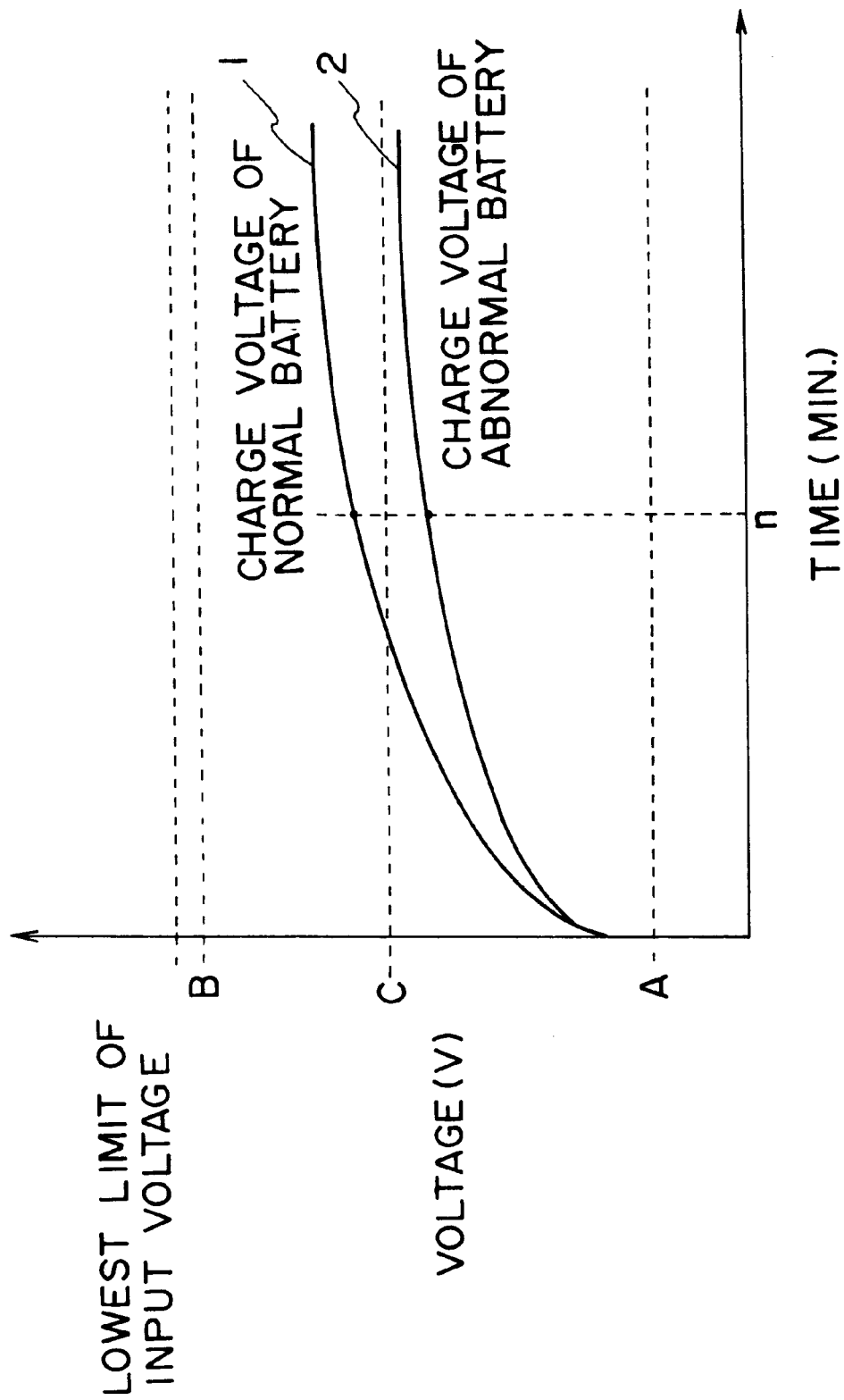
FIG. 10 is a graph diagram for explaining the variation of battery voltage and supply voltage from the start of charging for the secondary battery.

As shown in FIG. 10, as a result of examining the rising condition of the battery voltage at the charge stage, the time n is used to apply a predetermined value C (the battery rating was set at 6V in this example) that can be judged at the early stage from start of the charge, while noting that the variation of charge state for a normal battery (curve 1) is different from the variation of battery voltage for an abnormal battery exhausting its span of life (curve 2). This time n can be used in a range from 10 seconds to about several minutes, but this example adopted a region where the voltage is changed from a rapid voltage rise to a gradual rise (i.e., n is 120 seconds, or 2 minutes in minute indication.)

Note that in FIG. 10, the predetermined values A, B and the voltage of the AC adaptor that is the lowest limit of the input voltage at S7 are indicated by broken lines.

Accordingly, after waiting for the time n set at process S11 to pass by, the routine proceeds to the battery voltage check at process S12. If the battery voltage detected here is greater than or equal to the predetermined value C, the battery is judged as a chargeable battery, so that the charge is continued, and the above flows of S7 to S14 are repeated until the passage of a predetermined charging time (10 hours in this example) is confirmed at process S15. At process S14, a battery trouble is indicated as the voltage is below predetermined value C, and the charge is immediately stopped. The charge is carried out while performing such a safety process, and the charge is finished if the charging time has passed without trouble. Thereby, the charged battery can be placed in the state where at least an acceptable recording can be accomplished.

In this way, with the example according to the present invention, a cheap, quick and secure judgment can be accomplished, so that it is possible to provide the power source circuit with an improved reliability of the charge function and a wasteful operation time prevented, and particularly, a printer with the recording unusable period largely decreased.

The predetermined value C as above described is set at the same value as a rating of the battery (including a rating of about –0.5V in a substantially same meaning), and the above period is preferable within several minutes after start of the charge during which a normal battery exceeds the reference value. This is because the charge function itself is set so that it can make a stable charge for the rating of the battery.

In the above example, three kinds of judgments are performed, but from the technical points as above described, all the judgments are not necessarily required for the present invention, but it will be understood that other mechanical judgments can be included in the present invention. Of course, the equivalent judgment configurations are preferable for the present invention.

Figure 11:
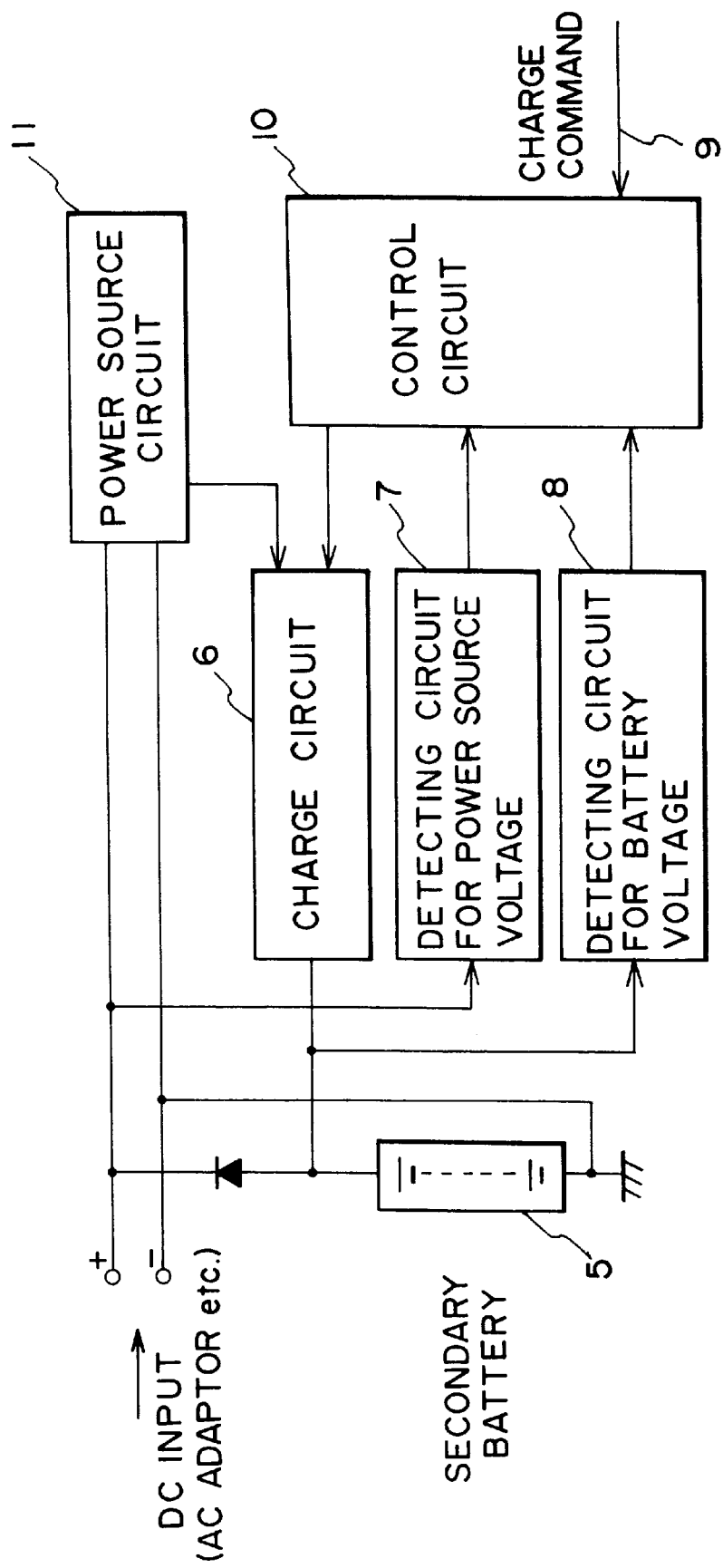
FIG. 11 is a block diagram of essential parts according to the present invention.

As a block configuration for executing the flow as shown in FIG. 1, the example of FIG. 11 can be shown.

FIG. 11 shows a circuit configuration of the present invention, which is applicable to various kinds of devices depending on the control subject of a control circuit 10. A power source circuit 11 is wired so that a direct current DC is directly supplied, with a plus side of its wiring being connectable via a one-directional diode to the plus side of a secondary battery 5 (battery change switch is not shown, see FIG. 8), and a minus side of its wiring being connected to the earthed minus side of the secondary battery 5. A charge circuit 6 is located between a contact point between the plus side of the secondary battery 5 and the one-directional diode and the power source circuit 11. The charge circuit 6 is composed of transistors, current control resistors and a temperature fuse arranged in parallel with the resistors, thereby realizing a further lower price of the whole apparatus. If the charge command 9 is issued to the charge circuit 6 as previously described by the operator or other request, the control circuit 10 receiving this command instructs the charge circuit 6 to start the charge. A detecting circuit for the power source voltage 7 is connected to the plus side of the above wiring and sends a detected result to the control circuit 10, thereby to detect the voltage to be supplied to the power source circuit 11. A detecting circuit for battery voltage 8 is connected between the charge circuit 6 and the plus side of the secondary battery 5, and sends a detected result to the control circuit 10. With this configuration, the flow of FIG. 1 is executed.

Next, an example of an ink jet recording apparatus in which the present invention is particularly effective as a printer will be described with reference to FIGS. 7A to 9 and FIG. 12.

FIGS. 7A and 7B, and FIGS. 8A, 8B and 8C show a storage mechanism of the secondary battery applicable to the power source circuit and the printer of the present invention, and a power source jack.

Figure 7A:
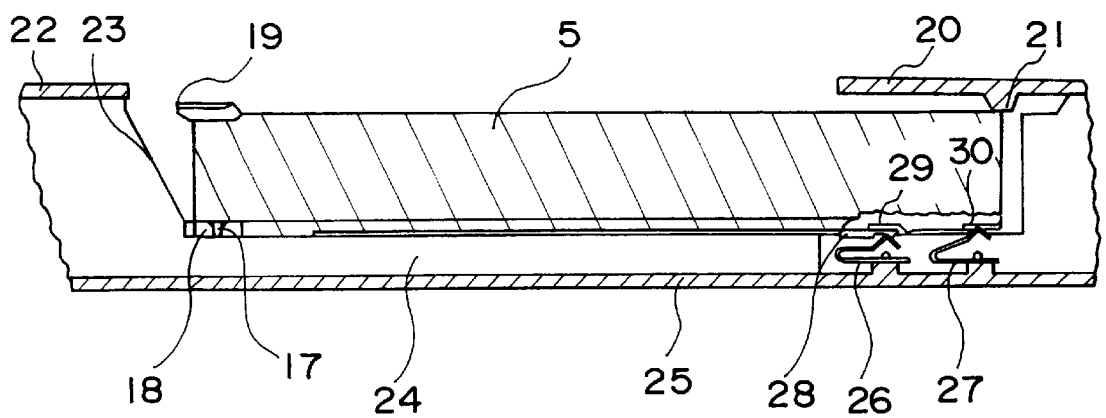
FIGS. 7A and 7B are explanation views of a secondary battery mounted on a printer according to the present invention, showing a mounted state and a loading or unloading state, respectively.
Figure 7B:
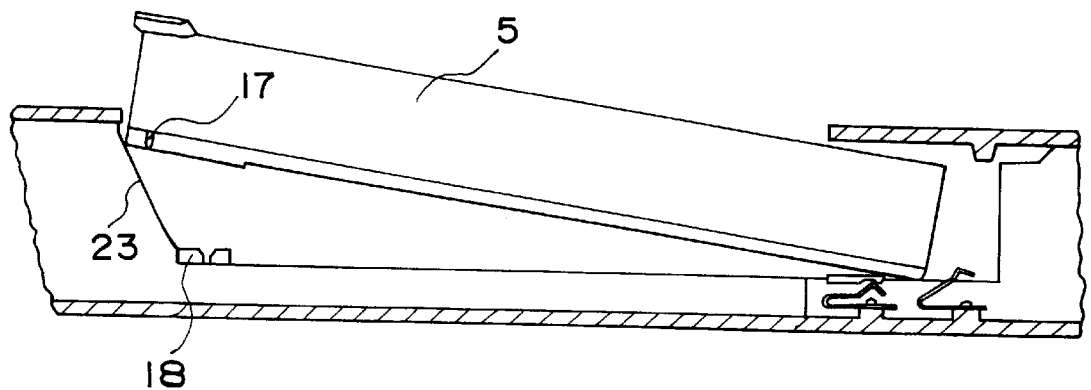

The secondary battery storage mechanism in FIGS. 7A and 7B is an example of the constitution for securing the electrical contact connections to effect a reliable recording by the use of the secondary battery 5. This constitution is one in which false conditions in mounting the secondary battery are eliminated and the judged result for an absence of a battery is further more complete. The secondary battery 5 is provided with a pin 17 engaging a positioning recess 18 in a lower portion of the apparatus main body for mounting, a corner portion provided along a slant surface of the apparatus side for guiding this pin 17 toward the recess 18 securely, and an ejection handle 19 on the back side in a loading direction. On a bottom face on the front side with respect to the loading direction of the secondary battery 5 are provided electrodes 29, 30 for taking out the voltage, but an upper face thereof is one abutted by a pressing convex portion 21 of a leaf spring 20 in the apparatus. Electrodes 26, 27 for receiving the voltage on the apparatus side are configured so that an electrode 27 on the back side in the loading direction is always made into contact with an electrode 30, while an electrode 26 is ordinarily made in non-contact with the electrode 29 by a switch 28 slidable for recording or charging with the secondary battery by the operator.

Accordingly, when this constitution is adopted, it is necessary to make an electrical connection between the electrode 29 and the electrode 26 for the initial operation, at the charging, by using the switch 28.

In any case, an advantage of this constitution is that the positioning of the secondary battery 5 can be made with a simple operation securely, whereby the constitution for positioning by interengagement thereof or the constitution for holding the connection of electrode contacts is practical for its purpose.

Figure 8A:
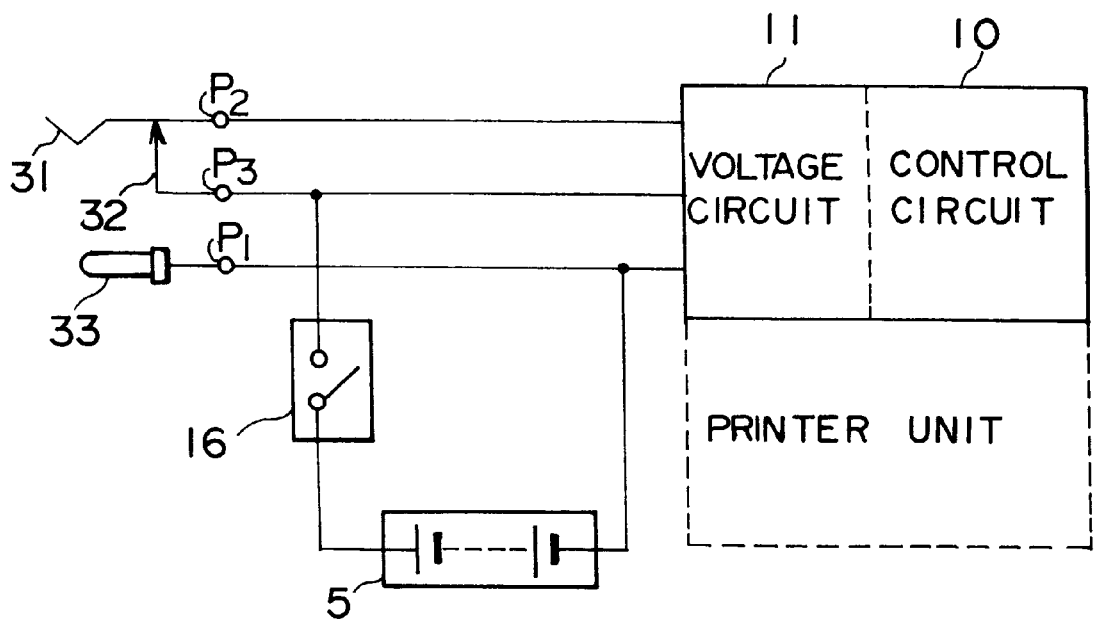
FIGS. 8A, 8B and 8C are views for explaining an adaptor contact portion involved in the charge according to the present invention, showing a circuit explanation view, a state view before mounting the adaptor and a state view after mounting the adaptor, respectively.
Figure 8B:
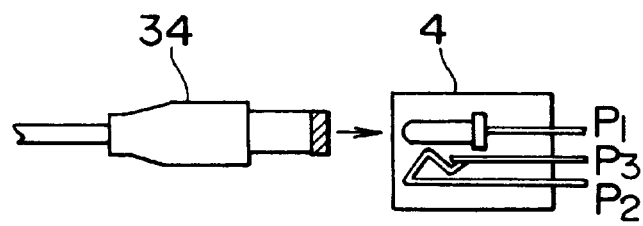
Figure 8C:
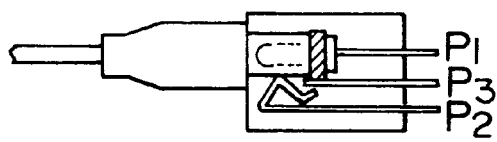

In FIGS. 8A, 8B and 8C, the connecting portion of the above electrode is indicated by a battery switch 16, and the explanation will be briefly given using a general configuration view (A) for the constitution of a power source jack 4, a mounting direction view (B) of AC adaptor 34 and a connection state view (C) between the AC adaptor 34 and the the power source jack 4.

As can be understood from FIG. 8A, when the AC adaptor 34 is not mounted, the driving with the secondary battery is allowed, and if the AC adaptor 34 is mounted to the power source jack 4, a contact point 31 deformable by the AC adaptor 34 is separated away from a contact point 32, and the power is supplied from the AC adaptor 34 to the power source circuit 11. In correspondence to FIG. 11, the contact point 33 is connected to the wiring P1 on the minus side, the contact point 32 is connected to the wiring P3 on the plus side of the secondary battery, and the contact point 31 is connected to the wiring P2 on the plus side of the power source circuit 11. Accordingly, if changing from the mounting state of the AC adaptor 34 to the on state of the switch 16, with the switch 16 being on, or vice versa, the printer unit can continue the driving state without stopping it temporarily.

Figure 9:
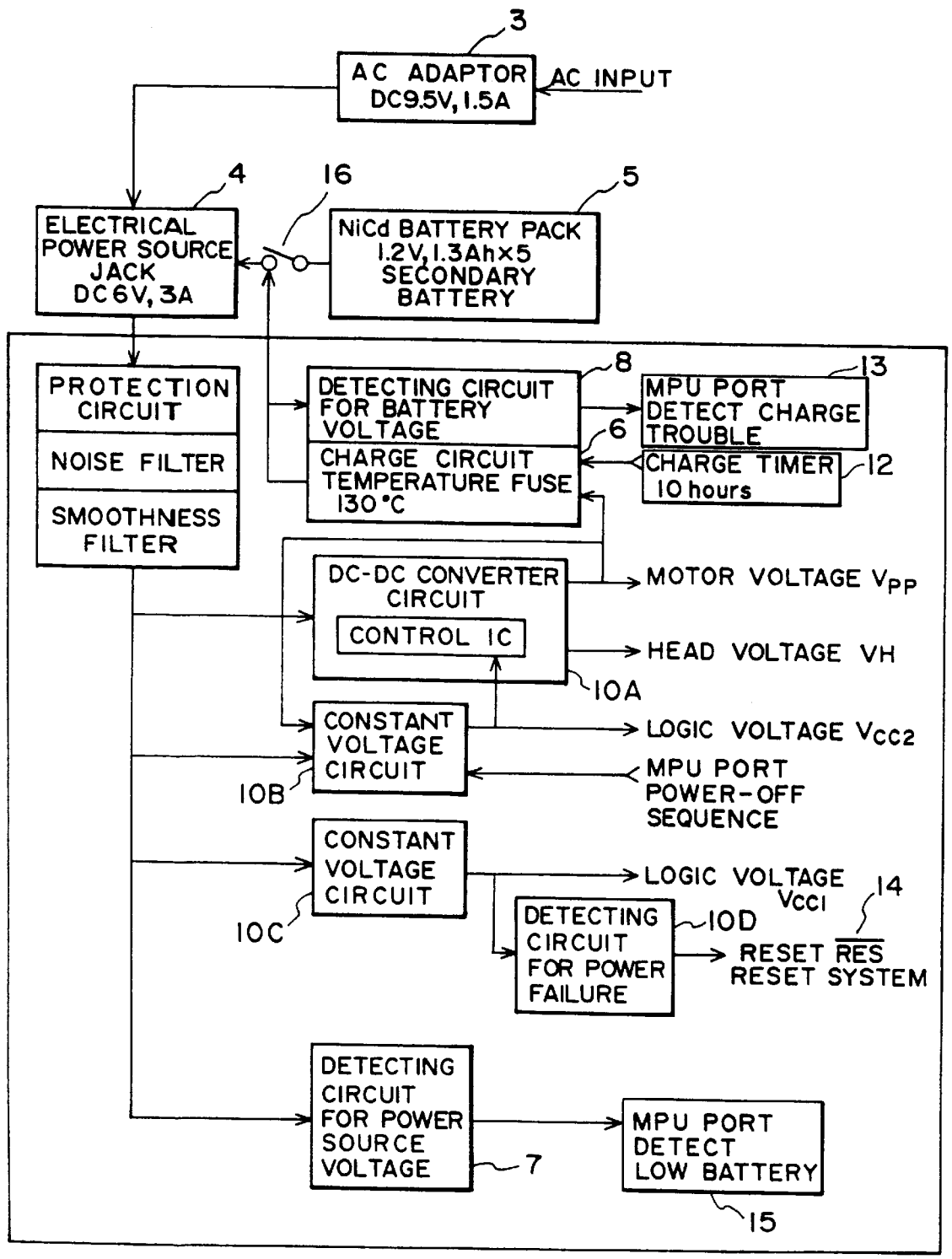
FIG. 9 is a block diagram of essential parts for a power source circuit and the printer in one example according to the present invention.

FIG. 9 is a diagram of the ink jet recording apparatus as previously described to which the present invention is applied, with the charge circuit 6 being provided with a temperature fuse (130° C.) for resistors. 12 is a charge timer for counting the charging time (10 hours) as previously described. The detecting circuit for battery voltage is connected to charge trouble detecting means 13 contained within central control means (MPU), and the detecting circuit for power source voltage 7 is connected to low battery detecting means 15 contained within the MPU, in which 10A is a converter circuit containing a control IC which outputs a motor voltage Vpp for driving the carriage and recovery unit recording medium conveying means, for receiving the supply voltage stabilized by processing means with a safety mechanism such as a protection circuit, a noise filter and a smoothness filter.

10B is constant voltage circuit for supplying a logic voltage Vcc2 to a main control circuit, in which the driving of the main control circuit is stopped by turning a main switch off. 10C is a constant voltage circuit for supplying the logic voltage Vcc1 to a cap of an ink jet or a (preliminary circuit MPU2 (not shown) for performing the initial operation, thereby to deal with a signal input from the host at an instant, in which the driving voltage is supplied irrespective of the off state of the main switch. The constant voltage circuit 10C has a detecting circuit for power failure, which generates a reset signal RES14 for automatically making the maintenance of the recording head by performing the capping for the recording head in accordance with the reset after detection of power failure and supplies the reset signal to the central control means MPU. Note that the constant voltage circuit 10B supplies a constant voltage to the control IC.

This ink jet printer apparatus is controlled to make the capping operation in accordance with the reset signal RES14 which is supplied to the central control means MPU when the electric power is initially supplied to the apparatus. Therefore, when the service condition on the host side is changed, the reset signal RES14 is also supplied to the central control means MPU, thereby performing the capping operation. In this way, when some failure occurs in a stationary state, it is important to make the capping operation. It is also important from this meaning to adopt a criterion of whether or not the capping operation can be made (for example, whether or not the carriage can be moved for the cap operation, or the relative movement to the cap can be made for the full-line ink jet head) as a check criterion for the charge state of the secondary battery as above described.

In the above example, 5.7V can be cited as the battery voltage at which the carriage movement cannot be made.

Figure 12:
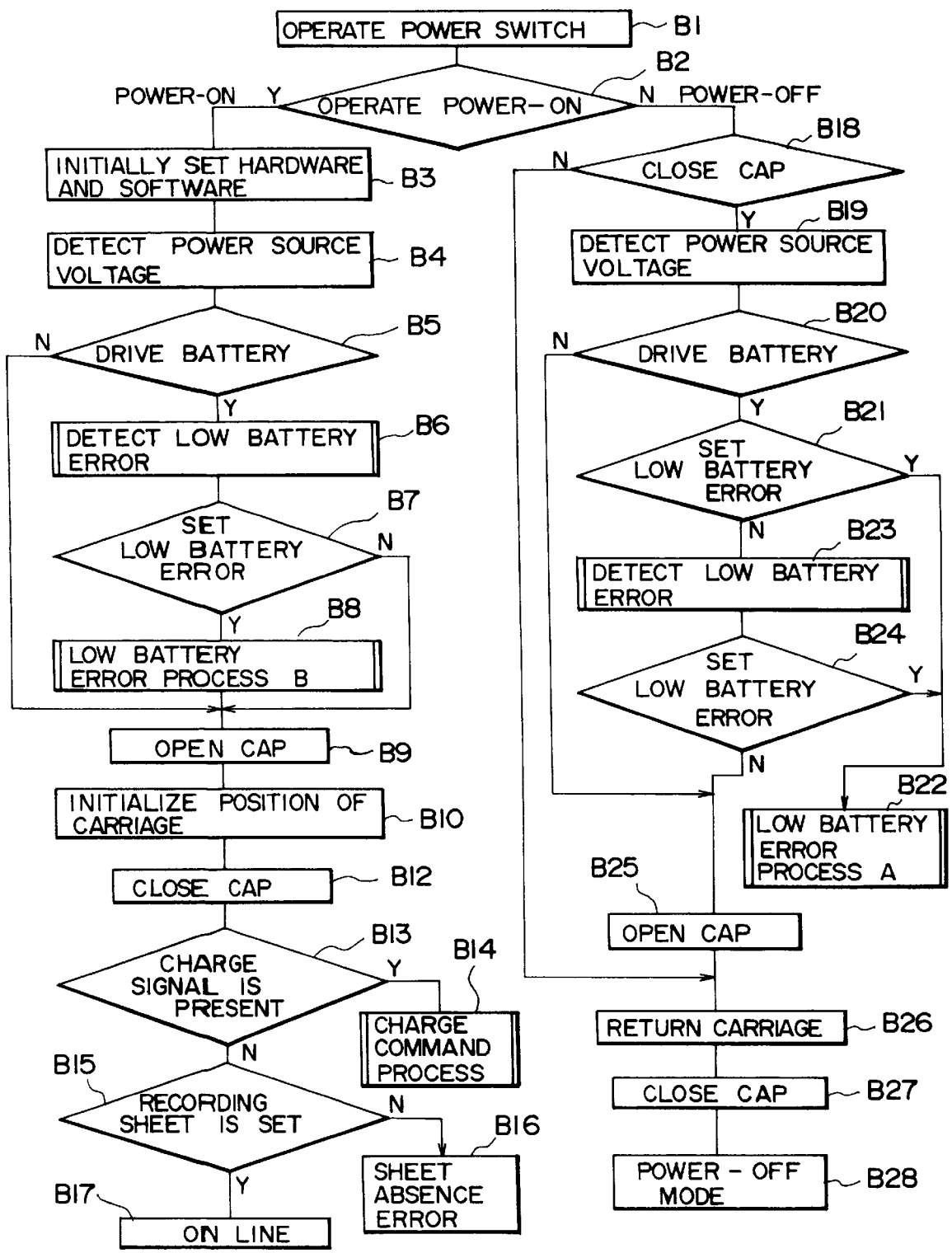
FIG. 12 is a flowchart of the printer in one example according to the present invention.

FIG. 12 is a flowchart showing one example of the power-on and power-off operation procedures for the ink jet recording apparatus as above described.

When an interrupt request with the operation of a power switch BB is entered into the preliminary circuit MPU2 ready for driving with the constant voltage circuit 10C, the circuit MPU2 controls to make the power-off operation if the recording apparatus is in power-on at the operation of the power switch, or conversely, make the power-on operation if it is in power-off.

If the power switch is operated at process B1, it is determined whether or not the power-on operation is made at process B2. If judged as the power-on operation, the routine proceeds to process B3, while if judged as the power-off operation, the routine proceeds to process B18.

First, the power-on operation will be described. The adaptor connection failure is prevented during the charge process in this process operation, but in this example, a further preferable judgment is made before the charge process.

At process B3, the initial setting (hardware and software) is made using the circuit MPU2. At process B4, the power source voltage is detected. And if judged as the battery drive at process B5, it is determined whether or not the battery is usable at process B6 as in processes S2 to S4 of FIG. 1, and if the battery is judged as unusable, a low battery flag is set, but if it is usable, the flag is not set. At process B7, this flag is judged, in which if it has been set, the low battery error process B is performed. This permits the connection of an AC adaptor, and if this connection is made within a predetermined time, this error is released and the routine proceeds to process B9. If this connection does not exist, the power is turned off and the routine is terminated.

If the AC drive is determined at process B5, or a determination is made that there is no flag at process B7, or the error is released at process B8, the routine proceeds to process B9, where the cap for the ink jet recording head is detached. This is the same as the operation processed with the issue of a reset signal.

Afterwards, the initialization of the carriage is performed at process B10. This is an operation for returning the recording head to a cap position after the carriage is once shifted to the recording area side. At process B12, the initial state can be made securer by performing the cap operation again for the returned recording head.

Here, it is determined whether or not the charge signal is present at process B13, and if present, the charge command process is performed at process B14. This is a processing based on the flowchart of FIG. 1. Then, as the adaptor has been already connected, the initial problem for the charge process is resolved. If not present, it is determined whether or not a recording sheet is set at process B15, in which if not set, an absence of a sheet is indicated at process B16, while if normal, the routine enters the on-line record mode.

On the other hand, proceeding to process B18, it is determined whether or not the recording head is closed with the cap, in which if not closed, the carriage is returned (process B26), the capping is made (process B27), and the power-off mode is entered (process B28). On the contrary, if it is closed, the same processings as at processes B4 to B7 are performed at processes B19 to B24, and process B28 is entered. However, for the battery drive judged as abnormal at processes B21 and B24, the low battery error processing is performed at process B22. This is a processing for simply stopping all the processings, unlike the process B.

In addition to the above example, the following processings are preferable. As the battery voltage may vary in a range from about 2V to 5V with the environmental temperature, it is further preferable to correct for this variation so that there is no influence for each variation. Specifically, the detecting circuit or the judging means has means for correcting for the detected result or the reference value depending on the environmental condition, including the temperature elevation with the service condition. Also, another method of controlling the charge to be stopped after making plural times of the judgment is preferable because the final judgment is made after the measurement of temperature elevation is stabilized. Here, the failure is once judged on the apparatus, and thereafter, the judgment is made for reconfirmation in changing the battery, then making the final judgment.

As the printer, it is preferable in practical use that the reference value is made a voltage at which the recording with the recording means can be accomplished, or a voltage at which means for maintenance of the recording head is activated. This maintenance means includes a cap or cleaning as will be described, but is not limited to these.

The present invention brings about excellent effects particularly in a recording head or a recording device of the bubble jet system among the various ink jet recording systems.

As to its representative constitution and principle, for example, one practiced by use of the basic principle disclosed in, for example, U.S. Pat. Nos. 4,723,129 and 4,740,796 is preferred. This system is applicable to either of the so-called on-demand type and the continuous type. Particularly, the case of the on-demand type is effective because, by applying at least one driving signal which gives rapid temperature elevation exceeding nucleus boiling corresponding to the recording information on electricity-heat converters arranged corresponding to the sheets or liquid channels holding a liquid (ink), heat energy is generated at the electricity-heat converters to effect film boiling at the heat acting surface of the recording head, and consequently the bubbles within the liquid (ink) can be formed corresponding one by one to the driving signals. By discharging the liquid (ink) though an opening for discharging by growth and shrinkage of the bubble, at least one droplet is formed. By making the driving signals into pulse shapes, growth and shrinkage of the bubble can be effected instantly and adequately to accomplish more preferably discharging of the liquid (ink) particularly excellent in response characteristic. As the driving signals of such pulse shape, those as disclosed in U.S. Pat. Nos. 4,463,359 and 4,345,262 are suitable.

Further excellent recording can be performed by employment of the conditions described in U.S. Pat. No. 4,313,124 of the invention concerning the temperature elevation rate of the above-mentioned heat acting surface.

As the constitution of the recording head, in addition to the combination of the discharging orifice, liquid channel, and electricity-heat converter (linear liquid channel or right-angled liquid channel) as disclosed in the above-mentioned respective specifications, the constitution by use of U.S. Pat. No. 4,558,333, or U.S. Pat. No. 4,459,600 disclosing the constitution having the heat acting portion arranged in the flexed region is also included in the present invention. In addition, the present invention also can be effectively made in the constitution as disclosed in Japanese Laid-Open Patent Application No. 59-123670 which discloses a constitution using a slit common to a plurality of electricity-heat converters as the discharging portion of the electricity-heat converter or Japanese Laid-Open Patent Application No. 59-138461 which discloses a constitution having a opening for absorbing a pressure wave of heat energy corresponding to the discharging portion.

Further, as the recording head of the full line type having a length corresponding to the maximum width of a recording medium which can be recorded by the recording device, either the constitution which satisfies its length by a combination of a plurality of recording heads as disclosed in the above-mentioned specifications or the constitution as one recording head integrally formed may be used, and the present invention can exhibit the effects as described above further effectively.

Here, the battery itself suitable for the present invention and also effective as a single constitution, and the constitution on the apparatus side will be described with reference to FIGS. 13 and 14C, in addition to FIGS. 7A and 7B.

The present invention of the battery is to provide a recording apparatus and a battery, having a battery holding unit from which the battery is easily detached, which is superior in protecting the contacts of the battery, and further can contribute to a smaller configuration with a simple construction.

Thus, the present invention is characterized in that the battery useful for a power source of the recording apparatus and detachable from the apparatus comprises a finger hold provided on a part of the battery.

Also, the present invention is a recording apparatus which can use the battery as a power source, characterized by comprising a rod-like battery having a finger hold at a rod-like end portion, holding means for detachably holding the battery, a case for covering the battery held by the holding means, an opening provided on a part of the case and used for an inlet and outlet opening in attaching or detaching the battery, and a switch member provided slidably between the contact point of the battery side and the contact point of the recording apparatus side and for turning the contact points in or out of contact with each other with the sliding.

With the above constitution, for example, in inserting the battery, the battery is inserted obliquely from an end portion opposite to the end portion where the finger hold of the battery is provided into an opening provided on a case for covering the battery, while in taking out the battery, it can be taken out by lifting one end portion of the battery with the finger hold in a reverse operation of insertion.

Also, the switch for turning on/off the power of the battery can be constructed such that, for example, the contact point on the recording apparatus side is formed of a spring member, and in separating the contact points, the switch member is slidingly moved against an elastic force of the spring member.

Figure 13:
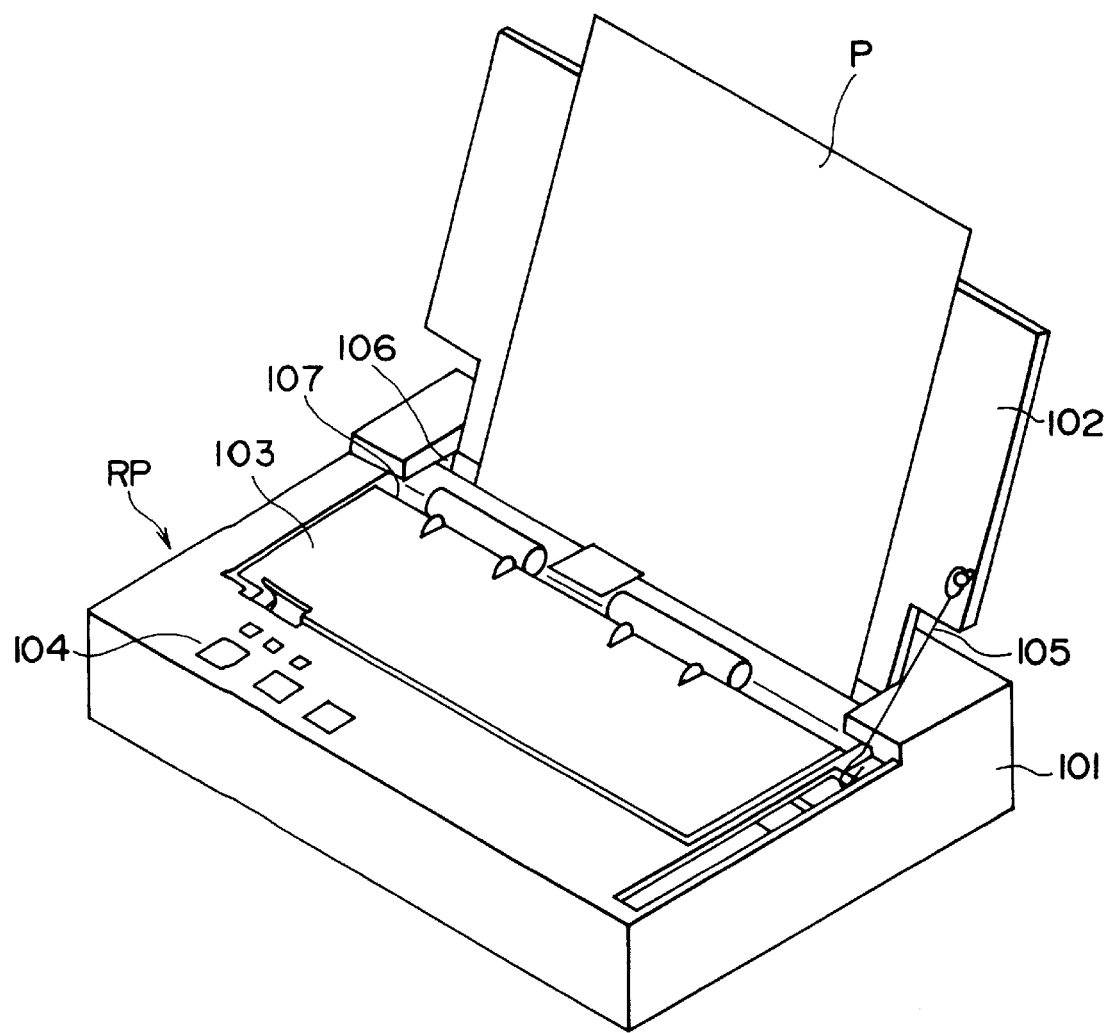
FIG. 13 is an external perspective view of the printer in one example according to the present invention.
Figure 14C:
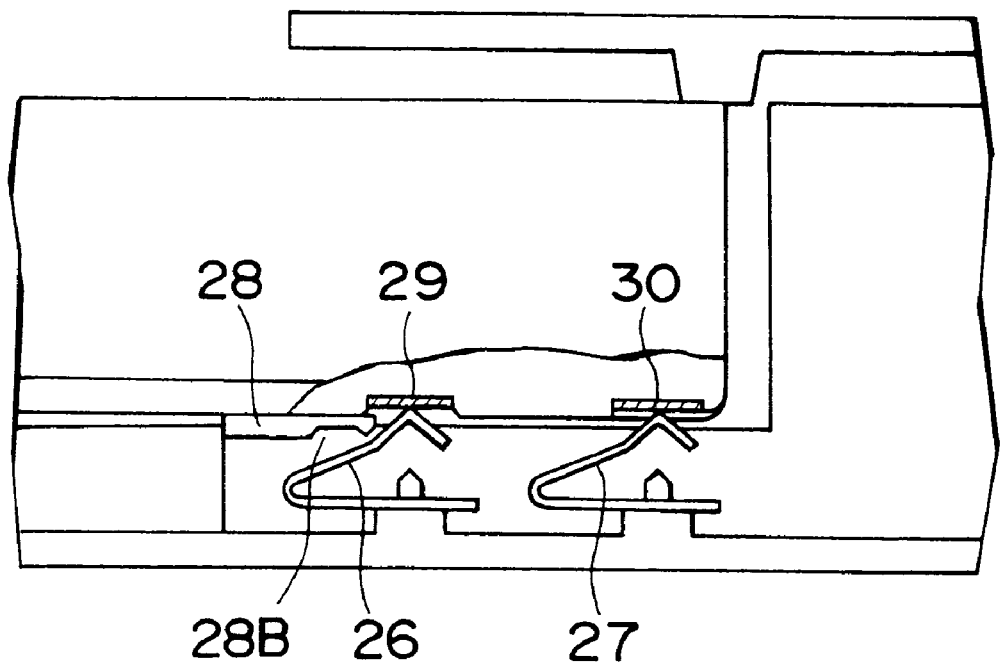

FIG. 13 is an external perspective view of an ink jet recording apparatus in one example of the present invention.

In FIG. 13, RP shows the ink jet recording apparatus, in which the apparatus RP is used in either an orientation as shown in the same figure or a vertical orientation as will be described later, and is of a comparatively small size.

101 is an apparatus housing, 102 is an outer cover, and 103 is an inner cover. When not used, the outer cover 102 is overlapped on the inner cover 103 so that the apparatus 100 is made compact. Thereby, user can transport the recording apparatus, for example, by containing it in a special bag. On a portion on the back side of the apparatus case 101, not shown, are provided a portion making up the battery and an opening for detaching the battery (which is ordinarily covered with a cover).

The outer cover 102 also can be used as a paper feed guide for a recording sheet P as shown in the figure, in which 106 as indicated in the figure becomes a paper feed opening. Further, the outer cover 102 is also used as a paper exhaust tray as will be described later.

In either of the above cases, 107 as indicated in the figure becomes a paper exhaust opening.

105 is a position fixing hook for the upper cover 102, and 104 is the operation key and display section.

In FIGS. 14A to 14C, 5 is a chargeable nickel cadmium battery which is substantially cylindrical. 5e is a guide formed on a portion of the battery main body, which is used for positioning in a longitudinal direction and its orthogonal direction, as well as guiding the attaching or detaching operation of the battery 5. 29, 30 are contact points of the battery side provided on the lower face side of the guide 5e near an end portion of the battery 5, 19 is a finger hold useful mainly in taking out the battery 1 from the battery case, and 17 is a rib useful in positioning the battery 5 in a longitudinal direction. 22A is the battery case for containing the battery 5, and 22B, 22C are holding plates for holding the battery 5 while positioning the battery 5 in the longitudinal direction and its orthogonal direction, extending substantially over the longitudinal direction of the battery. 22 is an outer case on the lower face side of the printer as shown in FIG. 13, showing a state with the battery case cover removed. The outer case 22 has its opening portion formed shorter than the length of the battery in the longitudinal direction, so as to cover the main body contact point as will be described later. 22D is an outer lower case of the printer, constituting the battery case 22A together with the outer case 22. 26 and 27 are main body contact points attached to the lower case 22D which are electrically connected to a printer circuit, not shown. The contact points 26 and 27 are shaped as the leaf spring, further securing the contact with the battery side contact points 29 and 30 with its elastic force. 28 is a battery switch carried between the contact point 26 and the holding plate 22C, and provided slidably therebetween. On a part of the battery switch 28 is formed a lug 28A, which projects through a hole 28C formed on a part of the outer case 22 out of the case, and can be operated by the user.

The mounting of the battery is performed in such a manner as to insert the battery 1 into the battery case 22A, with its contact point side of the battery being a lower side, and from the contact point side first, and slide down the lower side at the other end while sliding it on the guide slant face, as shown in FIGS. 7A and 7B. At the same time, the rib engages the groove, and a leading head portion of the battery engages the rib, thereby positioning the battery. The positioned state is shown in FIG. 7A.

In taking out the battery, after pulling it up by placing a finger on the finger hold 19, the battery is taken out incliningly along a guide slant surface by gripping the battery main body.

The battery switch 28 connects or disconnects the contact between the contact point of the battery side and the contact point 26 of the printer side by moving the lug left and right. FIG. 3 shows the state of connection. On a face in contact with the main body side contact point 5a of the battery switch 28 is provided the groove 28A, which serves to provided a click for preventing the switch 28 from inadvertently operating by the use of the elasticity of the main body side contact point 26.

Note that the contact points 30 and 27 are always placed in contact state a when the battery 5 is mounted.

As will be apparent from the above description, according to the present invention of the battery, for example, in inserting the battery, the battery is inserted obliquely from an end portion opposite to the end portion where the finger hold of the battery is provided into the opening provided on the case for covering the battery, while in taking out the battery, it can be taken out by lifting one end portion of the battery with the finger hold in a reverse operation of insertion.

Also, the switch for turning on/off the power with the battery can be constructed such that, for example, the contact point on the recording apparatus side is formed of a spring member, and in separating the contact points, the switch member is slided against an elastic force of the spring member.

As a result, even if the opening portion of the battery case is shorter than the length of the battery, the attachment or detachment of the battery is made easy, to protect the contact point of the battery, and there is provided a large advantage for a degree of freedom at a portion providing the battery case in the recording apparatus.

Also, the battery switch can be made a simpler constitution than a separate constitution, whereby it is possible to make the recording apparatus more compact.

The smaller apparatus can be obtained in addition to the above effects, by using the above battery constitution for the power source circuit or the recording apparatus of the present invention.

What is claimed is:

1. A charger apparatus for charging a rechargeable battery, said apparatus comprising:

supply means for supplying electric power to the battery to charge the battery;

first detecting means for detecting a voltage of the electric power supplied by said supply means;

first determining means for determining whether the voltage detected by said first detecting means is more than a first predetermined voltage after commencement of charging the battery;

first interrupting means for interrupting supplying of the electric power to the battery by said supply means in case said first determining means determines that the voltage detected by said first detecting means is less than the first predetermined voltage;

time counting means for performing time counting for a predetermined time after commencement of charging the battery in case said first determining means determines that the voltage detected by said first detecting means is more than the first predetermined voltage, the predetermined time being a time shorter than that required to terminate charging of the battery;

second detecting means for detecting a voltage of the battery after counting of the predetermined time by said time counting means;

second determining means for determining whether the voltage detected by said second detecting means is more than a second predetermined voltage lower than the first predetermined voltage;

second interrupting means for interrupting supplying of the electric power to the battery by said supply means in case said second determining means determines that the voltage detected by said second detecting means is less than the second predetermined voltage; and means for continuing supplying of the electric power to the battery in case said second determining means determines that the voltage detected by said second detecting means is more than the second predetermined voltage.

2. A charger apparatus according to claim further comprising means for generating a charging command, wherein said first interrupting means interrupts supply of electric power to the battery when the voltage of the electric power detected by said first detecting means is less than the first predetermined voltage after generation of the charging command.

3. A charger apparatus according to claim 1 or 2, further comprising indicating means for effecting a predetermined indication in accordance with a detection output of said first detecting means.

4. A charger apparatus according to claim 1, further comprising indicating means for effecting a predetermined indication in accordance with a detection output of said second detecting means.

5. A charger apparatus according to claim 1, further comprising indicating means for effecting a predetermined indication in accordance with a detection output of said second detecting means.

6. A charger apparatus according to claim 1, wherein the predetermined time is set as a time required for the voltage of a normal battery to reach a predetermined voltage after commencement of charging.

7. A charger apparatus according to claim 6, wherein the predetermined voltage is equal to a rating voltage of the battery.

8. A recording apparatus for recording an image on a recording medium, said apparatus being supplied with electric power from a rechargeable battery, said apparatus comprising:

supply means for supplying electric power to the battery to charge the battery;

first detecting means for detecting a voltage of the electric power supplied by said supply means;

first determining means for determining whether the voltage detected by said first detecting means is more than a first predetermined voltage after commencement of charging the battery;

first interrupting means for interrupting supplying of the electric power to the battery by said supply means in case said first determining means determines that the voltage detected by said first detecting means is less than the first predetermined voltage;

time counting means for performing time counting for a predetermined time after commencement of charging the battery in case said first determining means determines that the voltage detected by said first detecting means is more than the first predetermined voltage, the predetermined time being a time shorter than that required to terminate charging of the battery;

second detecting means for detecting a voltage of the battery after counting of the predetermined time by said time counting means;

second determining means for determining whether the voltage detected by said second detecting means is more than a second predetermined voltage lower than the first predetermined voltage;

second interrupting means for interrupting supplying of the electric power to the battery by said supply means in case said second determining means determines that the voltage detected by said second detecting means is less than the second predetermined voltage; and means for continuing supplying of the electric power to the battery in case said second determining means determines that the voltage detected by said second detecting means is more than the second predetermined voltage.

9. A recording apparatus according to claim 8, further comprising means for generating a charging command, wherein said first interrupting means interrupts supply of electric power to the battery when the voltage of the electric power detected by said first detecting means is less than the first predetermined voltage after generation of the charging command.

10. A recording apparatus according to claim 8 or 9, further comprising indicating means for effecting a predetermined indication in accordance with a detection output of said first detecting means.

11. A recording apparatus according to claim 8, further comprising indicating means for effecting a predetermined indication in accordance with a detection output of said second detecting means.

12. A recording apparatus according to claim 8, further comprising indicating means for effecting a predetermined indication in accordance with a detection output of said second detecting means.

13. A recording apparatus according to claim 8, wherein the predetermined time is set as a time required for the voltage of a normal battery to reach a predetermined voltage after commencement of charging.

14. A recording apparatus according to claim 13, wherein the predetermined voltage is equal to a rating voltage of the battery.

15. A recording apparatus according to claim 8, further comprising recording means for recording an image on the recording medium, wherein said recording means includes a recording head having a plurality of recording elements.

16. A recording apparatus according to claim 15, wherein said recording means includes moving means for moving said recording head for a recording scan.

17. A recording apparatus according to claim 15, wherein said recording means includes moving means for moving the recording medium relative to said recording head.

18. A recording apparatus according to claim 16, wherein said moving means moves the recording medium relative to said recording head.

19. A recording apparatus according to any one of claims 15–18, wherein said recording means records an image by discharging ink droplets utilizing energy generated by the recording elements.

20. A recording apparatus according to claim 19, wherein said recording means discharges ink droplets by causing a state change in ink utilizing energy generated by the recording elements.

21. A charging apparatus for charging a rechargeable battery, said apparatus comprising:

determining means for determining a mounting condition of said battery by checking a voltage of said battery;

instructing means for instructing commencement of charging of said battery when said determining means determines that said battery is properly mounted;

inhibiting means for inhibiting charging of the battery when said determining means determines that the battery is not properly mounted;

first detecting means for detecting a charging voltage to said battery;

second detecting means for detecting a voltage of said battery; and control means for repeatedly checking the charging voltage detected by said first detecting means and the voltage of said battery detected by said second detecting means during a charging operation after instruction of charging by said instructing means, wherein said control means interrupts charging to said battery when the charging voltage detected by said first detecting means does not exceed a first reference voltage, and said control mean interrupts charging to said battery when the voltage of said battery detected by said second detecting means does not exceed a second reference voltage lower than the first reference voltage.

22. A charging apparatus according to claim 21, wherein said determining means determines the mounting condition of said battery in accordance with a detection result of said first detecting means before instructing of charging by said instructing means.

23. A charging apparatus according to claim 21 or 22, wherein determination of the mounting condition is performed by comparing the voltage of said battery with a reference value.

24. A charging apparatus according to claim 21, wherein said control means judges the voltage detected by said second detecting means as being abnormal when, after passage of a predetermined period at a charge voltage rising stage since a start of charging, the voltage of said battery is lower than a predetermined reference value.

25. A charging apparatus according to claim 24, wherein the predetermined reference value equals a rating of said battery, and the predetermined period is within several minutes after starting of the charge during which a voltage of a normal battery can exceed the predetermined reference value.

26. A charging apparatus according to claim 21, wherein said control means judges the charging voltage detected by said first detecting means as being abnormal when the charging voltage is lower than a predetermined reference level.

27. A charging apparatus according to claim 26, wherein the predetermined reference level is lower than a maximum charging voltage to said battery and higher than a maximum voltage of a fully charged battery.

28. A printer comprising:

recording means for recording;

a rechargeable battery supplying power to said recording means;

charging means for charging said rechargeable battery, said charging means comprising determining means for determining a mounting condition of said battery by checking a voltage of said battery, instructing means for instructing commencement of charging of said battery when said determining means determines that said battery is properly mounted, inhibiting-means for inhibiting charging of the battery when said determining means determines that the battery is not properly mounted, first detecting means for detecting a charging voltage to said battery, second detecting means for detecting a voltage of said battery, and control means for repeatedly checking the charging voltage detected by said first detecting means and the voltage of said battery detected by said second detecting means during a charging operation after instruction of charging by said instructing means, wherein said control means interrupts charging to said battery when the charging voltage detected by said first detecting means does not exceed a first reference voltage, and said control means interrupts charging to said battery when the voltage of said battery detected by said second detesting means does not exceed a second reference voltage lower than the first reference voltage.

29. A printer according to claim 28, wherein said determining means determines the mounting condition of said battery in accordance with a detection result of said first detecting means before instructing of charging by said instructing means.

30. A printer according to claim 28 or 29, wherein determination of the mounting condition is performed by comparing the voltage of said battery with a reference value.

31. A printer according to claim 30, wherein the reference value is a voltage at which recording can be effected with said recording means.

32. A printer according to claim 30, further comprising means for maintenance of said recording means, wherein the reference value is a voltage at which said maintenance means can be activated.

33. A printer according to claim 28, wherein said control means judges the voltage detected by said second detecting means as being abnormal when, after passage of a predetermined period at a charge voltage rising stage since a start of charging, the voltage of said battery is lower than a predetermined reference value.

34. A printer according to claim 33, wherein the predetermined reference value equals a rating of said battery, and the predetermined period is within several minutes after starting of the charge during which a voltage of a normal battery can exceed the predetermined reference value.

35. A printer according to claim 28, wherein said control means judges the charging voltage detected by said first detecting means as being abnormal when the charging voltage is lower than a predetermined reference level.

36. A printer according to claim 35, wherein the predetermined reference level is lower than a maximum charging voltage to said battery and higher than a maximum voltage of a fully charged battery.

37. A printer according to claim 28, wherein said recording means comprises a thermal recording head and means for moving a recording medium relative to said thermal recording head.

38. A printer according to claim 37, wherein said thermal recording head comprises an ink jet recording head in which ink is discharged by film boiling of the ink which is caused by thermal energy generated by said recording head.

39. A printer according to claim 28, further comprising a frame, wherein said battery is detachable from said frame and said battery comprises a finger grasping portion thereon.

* * * * *

UNITED STATES PATENT AND TRADEMARK OFFICE
CERTIFICATE OF CORRECTION

PATENT NO. : 6,067,101
DATED : May 23, 2000
INVENTOR(S) : Arakawa et al.

It is certified that error appears in the above-identified patent and that said Letters Patent is hereby corrected as shown below:

Title Page,
Item [56] References Cited:
U.S. PATENT DOCUMENTS,
--4,577,203    3/1986   Kawamura..................346/140R-- and
--4,639,655    1/1987   Westhaver et al..................320/38X-- should be inserted.

Column 1:
Line 33, "to" should be deleted.
Line 34, "in lower" should read --lower in--.

Column 2:
Line 34, "composed" should read --comprised--.
Line 44, "for" (second occurrence) should be deleted.

Column 3:
Line 4, "representative" should read --representative--.
Line 56, "performing" should read --performing the judgement--.
Line 57, "of the judgement" should be deleted.

Column 5:
Line 40, "port s" should read --ports--.

Column 6:
Line 42, "back portion heat fused" should read --heat fused back portion--.

Column 7:
Line 25, "parallel piped" should read --parallelepiped--.
Line 31, "parallel piped" should read --parallelepiped--.
Line 40, "parallel piped" should read --parallelepiped--.
Line 48, "parallel piped" should read --parallelepiped--.

Column 8:
Line 55, "a" should be deleted.

Column 9:
Line 35, "as" should be deleted.

UNITED STATES PATENT AND TRADEMARK OFFICE
CERTIFICATE OF CORRECTION

PATENT NO. : 6,067,101
DATED : May 23, 2000
INVENTOR(S) : Arakawa et al.

It is certified that error appears in the above-identified patent and that said Letters Patent is hereby corrected as shown below:

Column 10:
Line 16, "Li" should read --$L_1$--.

Column 11:
Line 38, "a" (second occurrence) should be deleted.

Column 12:
Line 28, "span of life" should read --life span--.
Line 44, "a" should be deleted.

Column 13:
Line 20, "composed" should read --comprised--.
Line 50, "further" should be deleted.

Column 14:
Line 55, "(preliminary" should read --preliminary--.

Column 15:
Line 16, "above described." should read --described above.--.
Line 23, "BB" should read --$B_1$--.

Column 16:
Line 28, "plural times of the judgement" should read --the judgement plural times--.
Line 40, "excel lent" should read --excellent--.
Line 60, "though" should read --through--.

Column 17:
Line 19, "a" (second occurrence) should read --an--.

Column 18:
Line 12, "user" should read --a user--.

Column 19:
Line 11, "provided" should read --provide--.

UNITED STATES PATENT AND TRADEMARK OFFICE
CERTIFICATE OF CORRECTION

PATENT NO. : 6,067,101
DATED : May 23, 2000
INVENTOR(S) : Arakawa et al.

It is certified that error appears in the above-identified patent and that said Letters Patent is hereby corrected as shown below:

Column 20:
Line 17, "claim" should read --claim 1,--.
Line 32, "1," should read --2,--.

Column 22:
Line 56, "means;" should read --means; and--.
Line 63, "inhibiting-means" should read --inhibiting means--.

Column 23:
Line 12, "detesting" should read --detecting--.

Signed and Sealed this

Seventh Day of August, 2001

*Attest:*

*Attesting Officer*

NICHOLAS P. GODICI
*Acting Director of the United States Patent and Trademark Office*